(12) United States Patent
Koide et al.

(10) Patent No.: US 8,727,495 B2
(45) Date of Patent: May 20, 2014

(54) LIQUID DROPLET DISCHARGE APPARATUS, PIEZOELECTRIC ACTUATOR, AND METHOD FOR PRODUCING LIQUID DROPLET DISCHARGE APPARATUS

(75) Inventors: Shohei Koide, Nagoya (JP); Hiromitsu Mizutani, Ichinomiya (JP); Hirofumi Kondo, Tajimi (JP); Hiroto Sugahara, Ama (JP)

(73) Assignee: Brother Kogyo Kabushiki Kaisha, Aichi-ken (JP)

( * ) Notice: Subject to any disclaimer, the term of this patent is extended or adjusted under 35 U.S.C. 154(b) by 126 days.

(21) Appl. No.: 13/369,659

(22) Filed: Feb. 9, 2012

(65) Prior Publication Data
US 2012/0249681 A1    Oct. 4, 2012

(30) Foreign Application Priority Data
Mar. 29, 2011    (JP) ................................. 2011-071485

(51) Int. Cl.
*B41J 2/14* (2006.01)
*B41J 2/16* (2006.01)
*B41J 2/045* (2006.01)

(52) U.S. Cl.
USPC ................................. 347/48; 347/68; 347/70

(58) Field of Classification Search
None
See application file for complete search history.

(56) References Cited

U.S. PATENT DOCUMENTS

| 7,466,067 B2 | 12/2008 | Sugahara | |
|---|---|---|---|
| 7,527,361 B2 * | 5/2009 | Sugahara | 347/68 |
| 2006/0132550 A1 | 6/2006 | Sugahara | |

FOREIGN PATENT DOCUMENTS

| JP | 2002-086717 | 3/2002 |
|---|---|---|
| JP | 2006-156987 | 6/2006 |
| JP | 2010-082942 | 4/2010 |
| JP | 2010-214789 | 9/2010 |
| JP | 2010-214795 | 9/2010 |

OTHER PUBLICATIONS

Notice of Reasons for Rejection for Japanese for Patent Application No. 2011-071485 dated Apr. 16, 2013.

* cited by examiner

*Primary Examiner* — Stephen Meier
*Assistant Examiner* — Renee I Wilson
(74) *Attorney, Agent, or Firm* — Frommer Lawrence & Haug LLP

(57) ABSTRACT

A liquid droplet discharge apparatus, which discharges liquid droplets of a liquid, includes: a flow passage unit which is formed with a plurality of nozzles for discharging the liquid droplets of the liquid and a plurality of liquid flow passages including a plurality of pressure chambers communicated with the plurality of nozzles respectively; an actuator which has a sealing plate joined to the flow passage unit for defining the plurality of pressure chambers and which applies a pressure to the liquid contained in each of the plurality of pressure chambers by changing a volume of each of the plurality of pressure chambers by deforming the sealing plate; and a deformation adjusting member which adjusts a deformation amount of the sealing plate.

10 Claims, 16 Drawing Sheets

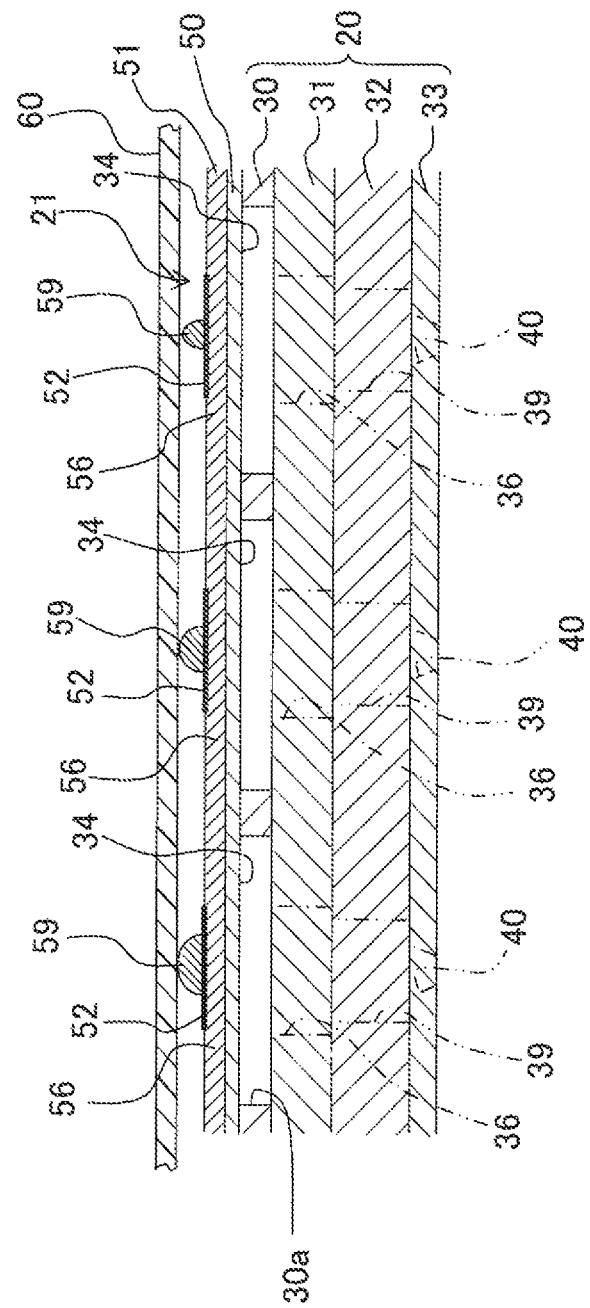

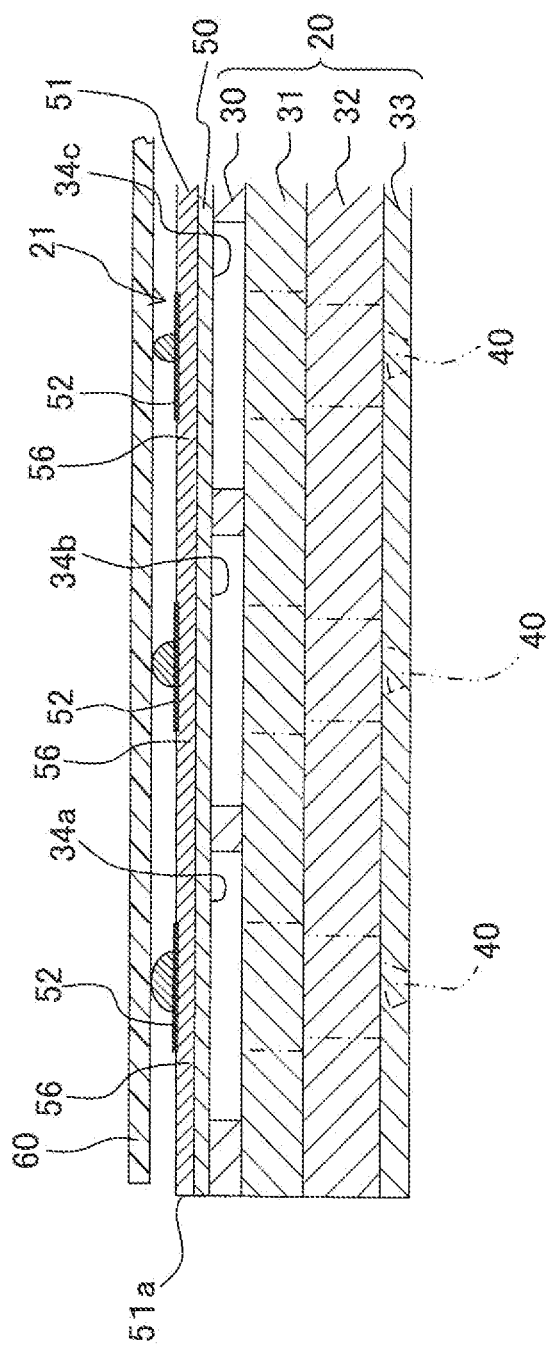

LIQUID DROPLET DISCHARGE APPARATUS, PIEZOELECTRIC ACTUATOR, AND METHOD FOR PRODUCING LIQUID DROPLET DISCHARGE APPARATUS

CROSS REFERENCE TO RELATED APPLICATION

The present application claims priority from Japanese Patent Application No. 2011-071485, filed on Mar. 29, 2011, the disclosure of which is incorporated herein by reference in its entirety.

BACKGROUND OF THE INVENTION

1. Field of the Invention

The present invention relates to a liquid droplet discharge apparatus, a piezoelectric actuator, and a method for producing the liquid droplet discharge apparatus.

2. Description of the Related Art

Conventionally, a liquid droplet discharge apparatus is known, which is constructed so that liquid droplets are discharged individually from a plurality of nozzles. For example, Japanese Patent Application Laid-open No. 2010-214795 discloses an ink-jet head which discharges liquid droplets of an ink from a plurality of nozzles respectively. The ink-jet head is provided with a flow passage unit which is formed with the plurality of nozzles and ink flow passages including, for example, a plurality of pressure chambers communicated with the plurality of nozzles respectively, and a piezoelectric actuator which discharges the ink from the corresponding nozzles by individually applying the pressure to the ink contained in the plurality of pressure chambers.

Further, the piezoelectric actuator has a vibration plate (sealing plate) which forms one wall portion of each of the plurality of pressure chambers by being joined to the flow passage unit so that the plurality of pressure chambers are covered therewith, a piezoelectric layer which is provided in a planar form on the vibration plate while ranging over the plurality of pressure chambers, and two types of electrodes (individual electrodes and common electrode) which are provided to interpose, in the thinness direction, portions of the piezoelectric layer opposed to the plurality of pressure chambers respectively. When a predetermined driving voltage is applied between the two types of electrodes corresponding to a certain pressure chamber, then the deformation (piezoelectric strain) arises in the piezoelectric layer portion interposed between the electrodes, and the vibration plate is deformed (vibrated). The volume of the pressure chamber is changed in accordance with the deformation of the vibration plate which is one wall portion of the pressure chamber. Accordingly, the pressure is applied to the ink contained in the pressure chamber, and the liquid droplets of the ink are discharged from the nozzles.

In the meantime, in the case of the liquid droplet discharge apparatus such as the ink-jet head having the plurality of nozzles as disclosed in Japanese Patent Application Laid-open No. 2010-214795, it is preferable that the discharge characteristics (amounts of liquid droplets and speeds of liquid droplets to be discharged) are evenly uniformized among the plurality of nozzles. However, actually, the discharge characteristics are different from each other among the plurality of nozzles in many cases. In the case of the exemplary ink-jet head described in Japanese Patent Application Laid-open No. 2010-214795, for example, if any difference arises in the characteristic of the piezoelectric element on account of, for example, the dispersion of the thickness of the piezoelectric layer portion (piezoelectric element) opposed to each of the plurality of pressure chambers, the deformation amount is dispersed when a predetermined driving voltage is applied. In another situation, if the constraint condition, which relates to the vibration plate and the piezoelectric layer, slightly differs among the plurality of pressure chambers, any difference also arises in the deformation amount of the vibration plate among the plurality of pressure chambers. If any difference arises in the deformation amount of the vibration plate among the plurality of pressure chambers as described above, then the pressure, which is applied to the ink, is dispersed, i.e., the liquid droplet speed and/or the liquid droplet amount is/are dispersed. Further, it is also considered that the dispersion of the discharge characteristics may be caused among the plurality of nozzles on account of any dimensional error of the ink flow passage formed in the flow passage unit including, for example, the pressure chamber and the nozzle.

SUMMARY OF THE INVENTION

An object of the present invention is to suppress the dispersion of discharge characteristics of a plurality of nozzles.

According to a first aspect of the present invention, there is provided a liquid droplet discharge apparatus which discharges liquid droplets of a liquid, the apparatus including: a flow passage unit which is formed with a plurality of nozzles for discharging the liquid droplets of the liquid and a plurality of liquid flow passages including a plurality of pressure chambers communicated with the plurality of nozzles respectively; an actuator which has a sealing plate joined to the flow passage unit for defining the plurality of pressure chambers and which applies a pressure to the liquid contained in each of the plurality of pressure chambers by changing a volume of each of the plurality of pressure chambers by deforming the sealing plate; and a deformation adjusting member which adjusts a deformation amount of the sealing plate, wherein the deformation adjusting member is constructed so that a portion of the sealing plate, which corresponds to one of the pressure chambers, has a deformation adjustment amount that is different from deformation adjustment amounts of portions of the sealing plate, which correspond to the other pressure chambers.

According to the first aspect of the present invention, the deformation adjustment amounts of the sealing plate for defining some of the pressure chambers are different from the deformation adjustment amounts of the sealing plate for defining the other pressure chambers, by means of the deformation adjusting member or the deformation adjusting members. Accordingly, the pressure, which is applied or imparted to the liquid, is adjusted among the plurality of pressure chambers. It is possible to decrease the dispersion of the discharge characteristic among the plurality of nozzles. In the present invention, the phrase "adjust the deformation amount" resides in the concept which includes both of the suppression of deformation to decrease the deformation amount and the acceleration of deformation to increase the deformation amount. Further, the present invention is not limited to such a mode or embodiment that the deformation amounts of the sealing plate are adjusted by the deformation adjusting members in relation to all of the pressure chambers. The present invention also includes such a mode or embodiment that any pressure chamber, in which the deformation amount of the sealing plate is not adjusted (deformation adjustment amount is zero), is present.

According to a second aspect of the present invention, there is provided a liquid droplet discharge apparatus which discharges liquid droplets of a liquid, the apparatus including: a flow passage unit which is formed with a plurality of nozzles for discharging the liquid droplets of the liquid and a plurality of liquid flow passages including a plurality of pressure chambers communicated with the plurality of nozzles respectively; an actuator which has a sealing member joined to the flow passage unit for defining the plurality of pressure chambers and which applies a pressure to the liquid contained in each of the plurality of pressure chambers by changing a volume of each of the plurality of pressure chambers by deforming the sealing member; and a deformation adjusting member which adjusts a deformation amount of the sealing member, wherein the deformation adjusting member is constructed to adjust the deformation amounts of portions of the sealing member for defining the pressure chambers communicated with the plurality of nozzles respectively, depending on discharge characteristics of the plurality of nozzles.

According to the second aspect of the present invention, the deformation amounts of the sealing plate are adjusted depending on the discharge characteristics (speeds of liquid droplets and amounts of liquid droplets) of the plurality of nozzles. Therefore, it is possible to effectively suppress the dispersion of the discharge characteristic among the plurality of nozzles.

According to a third aspect of the present invention, there is provided a piezoelectric actuator including: a plurality of piezoelectric elements; and a deformation adjusting member which adjusts a deformation amount of the piezoelectric element, wherein the deformation adjusting member is constructed so that deformation adjustment amounts of some of the piezoelectric elements are different from deformation adjustment amounts of the other piezoelectric elements.

In the piezoelectric actuator provided with the plurality of piezoelectric elements, the deformation amount, which is provided when a voltage applied, differs in some cases among the plurality of piezoelectric elements, for example, on account of the factor of any difference in the element characteristic. In the third aspect of the present invention, the deformation adjusting members are used so that the deformation adjustment amounts of some of the piezoelectric elements are different from those of the other piezoelectric elements. Accordingly, it is possible to decrease the dispersion of the deformation amount among the plurality of piezoelectric elements.

According to a fourth aspect of the present invention, there is provided a method for producing a liquid droplet discharge apparatus including a flow passage unit which is formed with a plurality of nozzles and a plurality of liquid flow passages including a plurality of pressure chambers communicated with the plurality of nozzles respectively and which has a surface on which the plurality of pressure chambers are open respectively; and an actuator which has a sealing plate joined to the surface of the flow passage unit so that openings of the plurality of pressure chambers are covered therewith and a plurality of driving elements provided on the sealing plate for deforming portions of the sealing plate facing the plurality of pressure chambers respectively and which applies a pressure to the liquid contained in each of the plurality of pressure chambers, the method including: a joining step for joining the actuator to the flow passage unit; and a deformation adjusting step for providing a deformation adjusting member for adjusting a deformation amount of the sealing plate for the actuator after the joining step so that portions of the sealing plate, which correspond to some of the pressure chambers, have deformation adjustment amounts that are different from deformation adjustment amounts of portions which correspond to the other pressure chambers.

According to the fourth aspect of the present invention, the discharge characteristic can be finally adjusted by providing the deformation adjusting member for the actuator in the state in which the actuator is joined to the flow passage unit and the liquid droplets can be discharged from the nozzle. Even when the flow passage unit and the actuator, which are provided as single units, have no inconvenience or malfunction to cause any dispersion of the discharge characteristic among the plurality of nozzles respectively, the characteristic of the actuator differs among the plurality of pressure chambers depending on the joined state when the actuator is joined to the flow passage unit. However, in the present invention, the deformation adjusting step, in which the deformation adjusting member is provided for the actuator, is performed after the joining step. Accordingly, the dispersion of the discharge characteristic, which is generated resulting from the joining step, can be suppressed to be small.

According to a fifth aspect of the present invention, there is provided a method for producing a liquid droplet discharge apparatus including a flow passage unit which is formed with a plurality of nozzles and a plurality of liquid flow passages including a plurality of pressure chambers communicated with the plurality of nozzles respectively and which has a surface on which the plurality of pressure chambers are open respectively; and an actuator which has a sealing plate joined to the surface of the flow passage unit so that openings of the plurality of pressure chambers are covered therewith and a plurality of driving elements provided on the sealing plate for deforming portions of the sealing plate facing the plurality of pressure chambers respectively and which applies a pressure to the liquid contained in each of the plurality of pressure chambers, the method including: a joining step for joining the actuator to the flow passage unit; an inspecting step for inspecting discharge characteristics of the plurality of nozzles after the joining step; and a deformation adjusting step for providing a deformation adjusting member for adjusting a deformation amount of the sealing plate for the actuator so that the deformation amount of the sealing plate is adjusted for the plurality of pressure chambers communicated with the plurality of nozzles respectively depending on the discharge characteristics of the plurality of nozzles obtained in the inspecting step.

According to the fifth aspect of the present invention, the discharge characteristics of the plurality of nozzles are inspected respectively in the state in which the liquid droplets can be discharged from the nozzles after the joining step. Further, the deformation amounts of the sealing plate are adjusted depending on the obtained result. Therefore, it is possible to effectively suppress the dispersion of the discharge characteristic among the nozzles.

BRIEF DESCRIPTION OF THE DRAWINGS

FIG. 5 shows a sectional view taken along a line V-V shown in FIG. 3.

FIG. 16 shows a sectional view illustrating an ink-jet head according to a thirteenth modified embodiment.

DETAILED DESCRIPTION OF THE PREFERRED EMBODIMENTS

Figure 1:
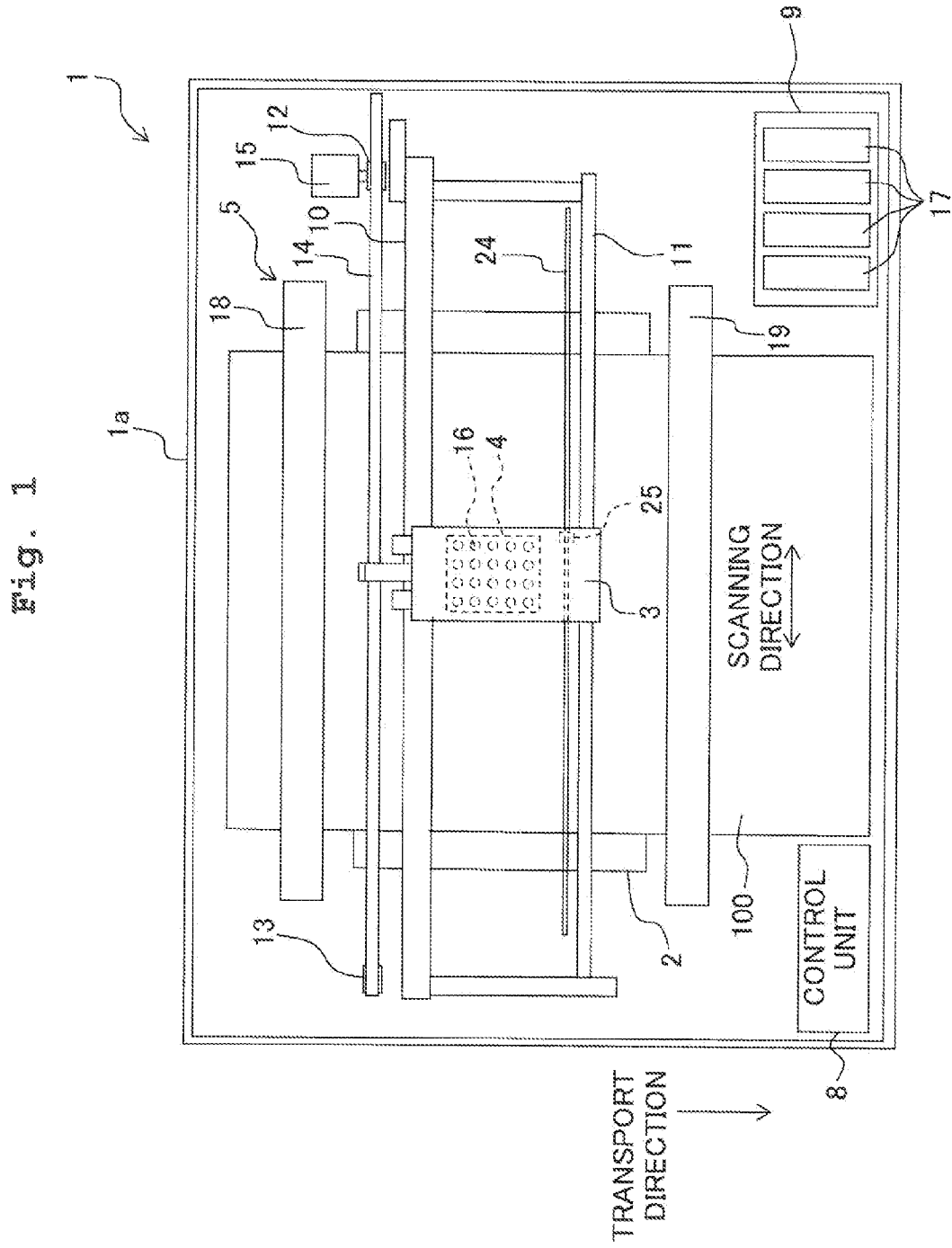
FIG. 1 shows a schematic plan view illustrating an ink-jet printer according to an embodiment of the present invention.

Next, an embodiment of the present invention will be explained. At first, an explanation will be made with reference to FIG. 1 about a schematic arrangement of an ink-jet printer 1. As shown in FIG. 1, the ink-jet printer 1 is provided with, for example, a platen 2 on which the recording paper 100 is placed, a carriage 3 which is reciprocatively movable in the scanning direction parallel to the platen 2, an ink-jet head 4 (liquid droplet discharge apparatus according to the present invention) which is carried on the carriage 3, a transport mechanism 5 which transports the recording paper 100 in the transport direction perpendicular to the scanning direction, and a control unit (controller) 8 which manages the overall control of the ink-jet printer 1.

The recording paper 100, which is the recording objective medium, is placed on the upper surface of the platen 2. Two guide rails 10, 11, which extend in parallel in the left-right direction (scanning direction) as shown in FIG. 1, are provided over or above the platen 2. The carriage 3 is constructed to be reciprocatively movable in the scanning direction along the two guide rails 10, 11 in the area opposed to the platen 2. An endless belt 14, which is applied to encircle two pulleys 12, 13, is connected to the carriage 3. When the endless belt 14 is driven to travel by means of a carriage driving motor 15, the carriage 3 is moved in the scanning direction in accordance with the travel of the endless belt 14.

A linear encoder 24, which has a large number of light-transmitting portions (slits) arranged in the scanning direction while providing spacing distances, is provided for a main printer body 1a of the printer 1. On the other hand, a head position detection sensor 25, which is composed of a transmissive type optical sensor having a light-emitting element and a light-receiving element, is provided for the carriage 3. The printer 1 recognizes the current position of the carriage 3 (ink-jet head 4) in relation to the scanning direction from the counted value (number of times of detection) of the light-transmitting portions of the linear encoder 24 detected by the head position detection sensor 25 during the movement of the carriage 3.

The ink-jet head 4 is attached to a lower portion of the carriage 3. The lower surface of the ink-jet head 4 (surface disposed on the opposite side of the paper surface shown in FIG. 1), which is parallel to the upper surface of the platen 2, is the liquid droplet jetting surface on which a plurality of nozzles 40 are open. Further, as shown in FIG. 1, a holder 9 is fixedly provided in the main printer body 1a of the printer 1.

Four ink cartridges 17, in which four color inks (black, yellow, cyan, magenta) are stored respectively, are installed to the holder 9. Although not shown, the ink-jet head 4, which is carried on the carriage 3, is connected to the holder 9 by means of four tubes (not shown). The inks, which are contained in the four ink cartridges 17, are supplied to the ink-jet head 4 respectively via the four tubes. The ink-jet head 4 discharges the four color inks from the plurality of nozzles 40 to the recording paper 100 placed on the platen 2.

The transport mechanism 5 has two transport rollers 18, 19 which are arranged to interpose the platen 2 in the transport direction. The recording paper 100, which is placed on the platen 2, is transported in the transport direction by means of the two transport rollers 18, 19.

In the ink-jet printer 1, the inks are discharged from the ink-jet head 4 which is reciprocatively movable in the scanning direction (left-right direction as viewed in FIG. 1) together with the carriage 3, with respect to the recording paper 100 which is placed on the platen 2. Further, the recording paper 100 is transported in the transport direction (downward direction as viewed in FIG. 1) by means of the two transport rollers 18, 19. Thus, an image and/or letters is/are printed on the recording paper 100.

Figure 2:
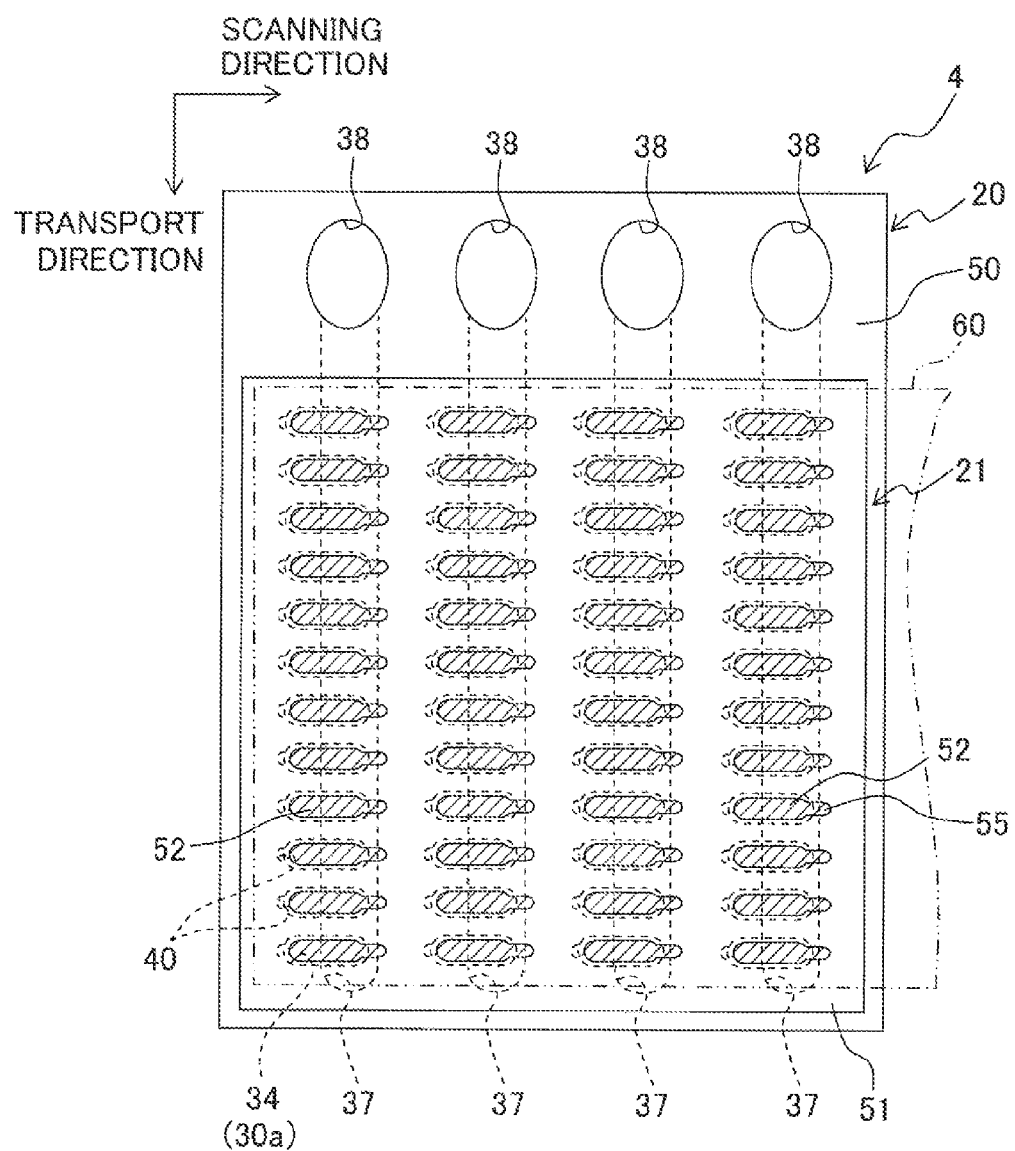
FIG. 2 shows a plan view illustrating an ink-jet head.
Figure 3:
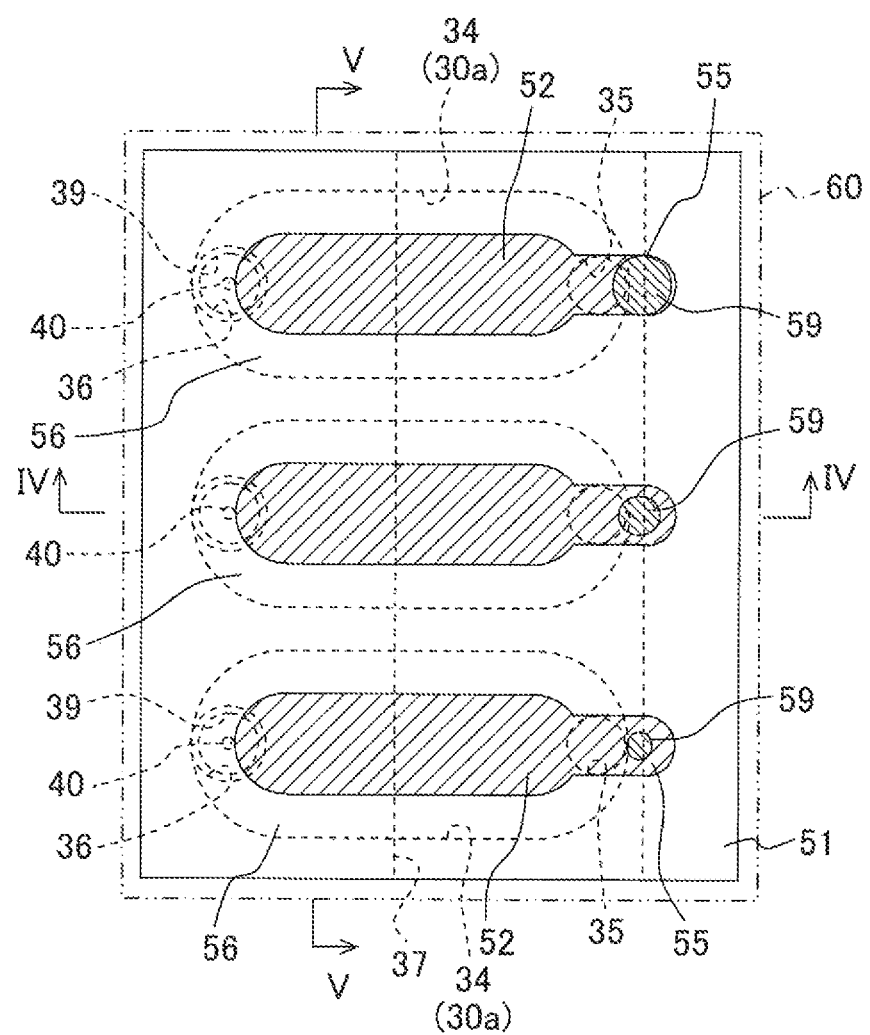
FIG. 3 shows a partial enlarged view illustrating those shown in FIG. 2.
Figure 4:
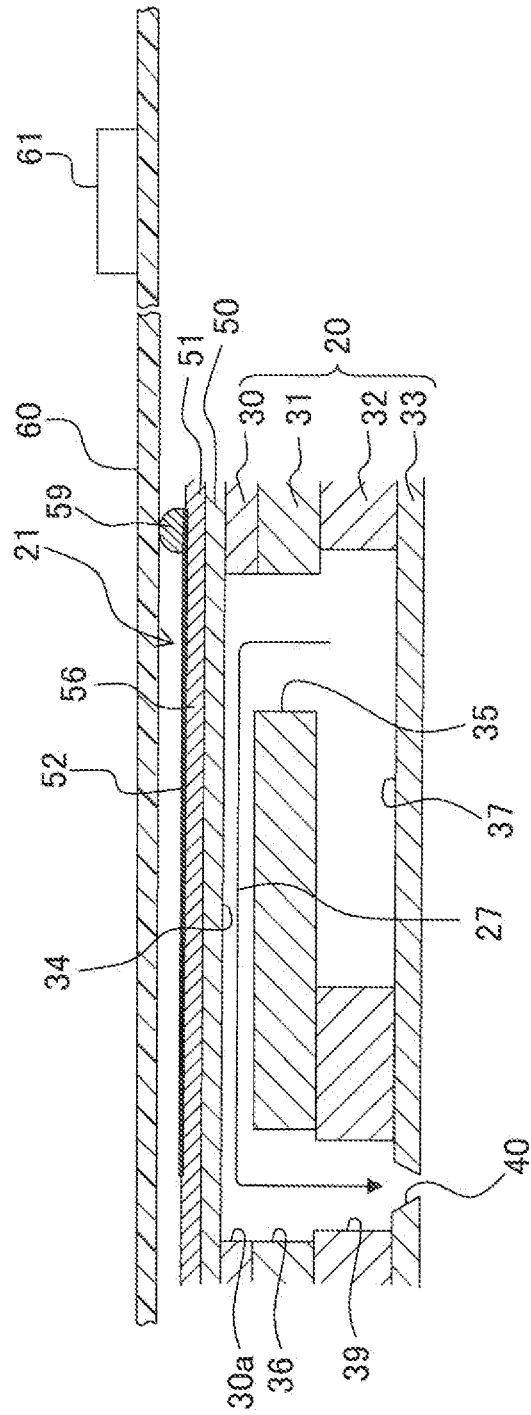
FIG. 4 shows a sectional view taken along a line IV-IV shown in FIG. 3.

Next, an explanation will be made about the ink-jet head 4 (liquid droplet discharge apparatus) with reference to FIGS. 2 to 5. In FIGS. 2 and 3, in order to simplify the drawings, a flexible printed circuit board 60, which is distinctly shown in FIGS. 4 and 5, is shown by alternate long and short dash lines.

As shown in FIGS. 2 to 5, the ink-jet head 4 is provided with a flow passage unit 20 which is formed with the nozzles 40 and ink flow passages including pressure chambers 34 communicated with the nozzles 40, and a piezoelectric actuator 21 which applies the pressure to the ink contained in the pressure chambers 34 in order to discharge the ink from the nozzles 40.

At first, the flow passage unit 20 is explained. As shown in FIGS. 4 and 5, the flow passage unit 20 is provided with a cavity plate 30, a base plate 31, a manifold plate 32, and a nozzle plate 33. The four plates 30 to 33 are joined in a stacked state. It is herein defined that the upward-downward direction (stacking direction of the plates 30 to 33) as viewed in FIGS. 4 and 5 is the upward-downward direction. The following explanation will be made by appropriately using the word to indicate the direction of "upward" or "downward".

The cavity plate 30, the base plate 31, and the manifold plate 32, which are included in the four plates 30 to 33, are plates made of metal such as stainless steel or the like. The ink flow passages, which include, for example, manifolds 37 and pressure chambers 34 as described later on, can be easily formed on the three plates 30 to 32 by means of the etching. The nozzle plate 33 is formed of a high molecular weight synthetic resin material such as polyimide or the like, and the nozzle plate 33 is adhered to the lower surface of the manifold plate 32.

As shown in FIGS. 2 to 5, a plurality of through-holes 30a, which are arranged along the flat surface, are formed through the cavity plate 30 which is positioned most upwardly among the four plates 30 to 33. The base plate 31 is stacked on the cavity plate 30, and the lower end openings of the plurality of through-holes 30a are closed thereby. Thus, the flow passage unit 20 is formed with a plurality of pressure chambers 34 having recessed shapes which are arranged in a planar form along the upper surface thereof and which are open upwardly. Further, a sealing plate 50 of the piezoelectric actuator 21 is joined to the upper surface of the flow passage unit 20 as described later on. Thus, the plurality of pressure chambers 34 are closed by the sealing plate 50. As shown in FIG. 2, the plurality of pressure chambers 34 are arranged in the transport direction (upward-downward direction as viewed in FIG. 2) to construct four arrays of pressure chamber arrays corresponding to the four color inks respectively. Each of the pressure chambers 34 is formed to have a substantially elliptical shape which is long in the scanning direction (left-right direction as viewed in FIG. 2) as viewed in a plan view.

As shown in FIGS. 3 and 4, communication holes 35, 36 are formed respectively at positions of the base plate 31 overlapped with the both end portions of the pressure chambers 34 as viewed in a plan view. Further, the manifold plate 32 is formed with four manifolds 37 extending in the transport direction so that the four manifolds 37 are overlapped with the portions of the pressure chambers 34 arranged in four arrays, the portions being disposed on the side of the communication holes 35 as viewed in a plan view. The four manifolds 37 are communicated with four ink supply ports 38 which are formed for the sealing plate 50 shown in FIG. 2. The four color inks (black, yellow, cyan, magenta), which are stored in the four ink cartridges 17 (see FIG. 1) respectively, are supplied respectively to the four manifolds 37 via the four ink supply ports 38. Further, a plurality of communication holes 39, which are allowed to continue to the plurality of communication holes 36, are also formed respectively at positions of the manifold plate 32 overlapped with the end portions of the plurality of pressure chambers 34 disposed on the side opposite to the manifold 37 as viewed in a plan view.

The plurality of nozzles 40, which are open downwardly, are formed at positions of the nozzle plate 33 overlapped with the plurality of communication holes 39 respectively as viewed in a plan view. As shown in FIG. 2, the plurality of nozzles 40 are arranged to be overlapped with the end portions of the plurality of pressure chambers 34 arranged in four arrays, disposed on the side opposite to the manifold 37 respectively, and the plurality of nozzles 40 constitute four arrays of nozzle arrays which discharge the four color inks respectively.

As shown in FIG. 4, the manifold 37 is communicated with the pressure chamber 34 via the communication hole 35, and the pressure chamber 34 is communicated with the nozzle 40 via the communication holes 36, 39. In this way, a plurality of individual ink flow passages 27, which range from the manifold 37 via the pressure chambers 34 to arrive at the nozzles 40, are formed in the flow passage unit 20.

Next, the piezoelectric actuator 21 will be explained. As shown in FIGS. 2 to 5, the piezoelectric actuator 21 is provided with the sealing plate 50 which is joined to the upper surface of the flow passage unit 20 (cavity plate 30), a piezoelectric layer 51 which is formed on the upper surface of the sealing plate 50 so that the piezoelectric layer 51 is opposed to the plurality of pressure chambers 34, and a plurality of individual electrodes 52 which are arranged on the upper surface of the piezoelectric layer 51.

The sealing plate 50 is a metal plate which has a substantially rectangular shape as viewed in a plan view. The sealing plate 50 is composed of, for example, iron-based alloy such as stainless steel or the like, copper-based alloy, nickel-based alloy, or titanium-based alloy. The sealing plate 50 is joined to the upper surface of the flow passage unit 20 so that the plurality of pressure chambers 34 having the recessed shapes as described above are covered therewith. The sealing plate 50 constitutes parts of the wall portions for defining the plurality of pressure chambers 34. That is, the sealing plate 50 defines the pressure chambers 34. Further, the upper surface of the conductive sealing plate 50 also serves as a common electrode which interposes the piezoelectric layer 51 between the upper surface of the conductive sealing plate 50 and the plurality of individual electrodes 52 to generate the electric field in the thickness direction in the piezoelectric layer 51. The upper surface of the conductive sealing plate 50 is always retained at the ground electric potential as described later on.

The piezoelectric layer 51, which is composed of a piezoelectric material containing a main component of lead titanate zirconate (PZT) that is a ferroelectric material and a solid solution of lead titanate and lead zirconate, is formed on the upper surface of the sealing plate 50 (surface disposed on the side opposite to the pressure chambers 34). The piezoelectric layer 51 is formed in a planar form while ranging over the plurality of pressure chambers 34.

The plurality of individual electrodes 52 (surface electrodes), each of which has a substantially elliptical planar shape that is one size smaller than the pressure chamber 34, are formed on the upper surface of the piezoelectric layer 51. The individual electrodes 52 are arranged respectively at the positions opposed to the central portions of the corresponding pressure chambers 34. The individual electrode 52 is composed of a conductive material such as gold, copper, silver, palladium, platinum, titanium or the like.

Further, a plurality of connecting terminals (joining terminals) 55, which are led to the areas not opposed to the pressure chambers 34 respectively from the end portions of the plurality of individual electrodes 52 arranged in four arrays disposed on the side of the communication holes 35 (on the outer side in the left-right direction as viewed in FIG. 2), are provided on the upper surface of the piezoelectric layer 51. As shown in FIGS. 3 to 5, protruding bumps 59, which are composed of a conductive material, are provided respectively for the plurality of connecting terminals 55.

The portions of the piezoelectric layer 51, which are interposed between the plurality of individual electrodes 52 and the sealing plate 50 as the common electrode, are polarized in the thickness direction beforehand to serve as the active portions for generating the deformation (piezoelectric strain) in the piezoelectric layer 51 when a predetermined voltage is applied between the individual electrode 52 and the sealing plate 50. In this embodiment, the portion of the piezoelectric layer 51 formed in a planar form to range over the plurality of pressure chambers 34, which is opposed to one pressure chamber 34, is one piezoelectric element 56 which deforms the portion of the sealing plate 50 opposed to the pressure chamber 34.

The flexible printed circuit board 60 (Flexible Printed Circuit (FPC)) is arranged to cover the plurality of individual electrodes 52 (plurality of piezoelectric elements 56) of the piezoelectric actuator 21 over or above the piezoelectric layer 51. As shown in FIG. 4, a driver IC 61, which drives the piezoelectric actuator 21, is mounted on FPC 60. The plurality of connecting terminals 55 are in conduction with the wiring lines of FPC 60 via the protruding bumps 59. In other words, the plurality of individual electrodes 52, which are provided on the upper surface of the piezoelectric layer 51, are electrically connected to the driver IC 61 via the connecting terminals 55, the bumps 59, and the wiring lines on FPC 60. When the piezoelectric actuator 21 is driven, the driver IC 61 applies a driving pulse signal having a predetermined driving electric potential to the individual electrode 52 corresponding to the desired nozzle 40 from which the ink is to be jetted. The sealing plate 50, which serves as the common electrode, is connected to the ground wiring line of the driver IC 61 via the wiring line of FPC 60. The sealing plate 50 is always retained at the ground electric potential.

Next, an explanation will be made about the function of the piezoelectric actuator 21 when the inks are discharged from the nozzles 40. When the driving pulse signal is selectively applied from the driver IC 61 to each of the plurality of individual electrodes 52, then the electric potential difference arises between the individual electrode 52 which is disposed on the upper side of the piezoelectric layer 51 and the sealing plate 50 which serves as the common electrode disposed on the lower side of the piezoelectric layer 51 retained at the ground electric potential, and the electric field is generated in the thickness direction at the portion which is interposed between the individual electrode 52 and the sealing plate 50. When the direction of polarization of the piezoelectric layer 51 is the same as the direction of the electric field, then the piezoelectric layer 51 is shrunk in the in-plane direction while extending in the thickness direction as the polarization direction thereof, and the portion of the sealing plate 50, which is opposed to the pressure chamber 34, is warped or flexibly bent so that the portion protrudes toward the pressure chamber 34 (unimorph deformation) in accordance with the shrinkage deformation of the piezoelectric layer 51 (piezoelectric element 56). In this situation, the volume of the pressure chamber 34 is decreased, and thus the pressure is applied to the ink contained therein. The liquid droplets of the ink are discharged from the nozzle 40 communicated with the pressure chamber 34.

In the meantime, when the discharge characteristic is dispersed among the plurality of nozzles 40 and the liquid droplet speed and/or the liquid droplet amount is/are not uniform, even if the identical driving pulse signal is applied from the driver IC 61 to the individual electrode 52, then the landing positions of the liquid droplets are deviated on the recording paper 100 (positional deviation of dots), and the unevenness of the dot size arises. Such a situation results in the decrease in the printing quality. In view of the above, in this embodiment, the deformation amounts of the sealing plate 50 (piezoelectric elements 56) are adjusted respectively in relation to the plurality of pressure chambers 34, and thus the deformation of the sealing plate 50 is intentionally allowed to differ. Accordingly, it is possible to suppress the dispersion of the discharge characteristic among the plurality of nozzles 40.

An explanation will be specifically made below about the structure or arrangement for adjusting the deformation amount of the sealing plate 50 described above. As shown in FIGS. 3 and 5, the conductive bumps 59, which are composed of the conductive material for connecting the individual electrodes 52 and the wiring lines of FPC 60, are stuck to the surfaces of the piezoelectric elements 56 disposed on the side opposite to the sealing plate 50, i.e., the surfaces of the respective connecting terminals 55 of the plurality of individual electrodes 52. In this embodiment, the connecting terminal 55, on which the bump 59 is provided, is led from the individual electrode 52 to the outside of the pressure chamber 34. Therefore, when the size of the bump 59 (sticking areal size of the conductive material) is small, the influence, which is exerted by the bump 59 on the deformation of the piezoelectric element 56, is small. However, when the size of the bump 59 is large, and the conductive material is spread to the area (surface of the piezoelectric element 56) opposed to the pressure chamber 34, then the deformation of the piezoelectric element 56 is inhibited in the area, and the deformation is consequently suppressed for the portion of the sealing plate 50 opposed to the pressure chamber 34.

In view of the above, in this embodiment, the sizes are not identical in relation to all of the plurality of bumps 59. The sizes of the plurality of bumps 59 are determined depending on the discharge characteristics of the nozzles 40 obtained by a discharge inspection performed beforehand. The sizes of the bumps 59 of some of the individual electrodes 52 are different from those of the bumps 59 of the other individual electrodes 52.

For example, it is assumed that the discharge characteristics are higher (liquid droplet speeds and liquid droplet amounts are larger) in an order of the upper nozzle 40, the central nozzle 40, and the lower nozzle 40 in relation to the three nozzles 40 aligned in the vertical direction as shown in FIG. 3. On this assumption, the bump 59, which corresponds to the upper nozzle 40 having the highest discharge characteristic, has the largest size, wherein the bump 59 is formed while being spread to the area opposed to the pressure chamber 34, the deformation of the piezoelectric element 56 is strongly suppressed, and the deformation amount is decreased as compared with a case in which the bump 59 is absent. On the contrary, the bump 59, which corresponds to the lower nozzle 40 having the low discharge characteristic, has the smallest size, wherein the bump 59 is formed in only the area disposed outside the pressure chamber 34, and the deformation of the piezoelectric element 56 is scarcely suppressed. That is, the intensity of the suppression of deformation (deformation adjustment amount) of the piezoelectric element 56 (sealing plate 50) differs among the three pressure chambers 34. In the case of the pressure chamber 34 in which the deformation of the piezoelectric element 56 is suppressed by the bump 59, the deformation of the sealing plate 50 is also suppressed, and the volume change of the pressure chamber 34 is decreased. Therefore, the pressure, which is applied to the ink, is also decreased, and the discharge characteristic is lowered. In this way, the sizes of the bumps 59 corresponding to the plurality of nozzles 40 respectively are determined depending on the discharge characteristics of the plurality of nozzles 40. Thus, the dispersion of the discharge characteristic is decreased among the plurality of nozzles 40.

In this embodiment, the bump 59, which is provided as the deformation adjusting member according to the present invention and which brings about the different intensity or extent of the suppression of deformation of the piezoelectric element 56 among the plurality of pressure chambers 34, is stuck or adhered to the piezoelectric element 56 (connecting terminal 55). Therefore, when the size (sticking areal size) of the bump 59 is changed, the deformation of the piezoelectric element 56 can be efficiently adjusted (suppressed). Further, the bump 59 provides the connection between the individual electrode 52 and FPC 60. When such a bump 59 is also used as the deformation adjusting member, it is unnecessary to provide any exclusive deformation adjusting member.

Next, an explanation will be made about a method for producing the ink-jet head 4 described above with reference to FIGS. 6A to 6E.

Figure 6A:
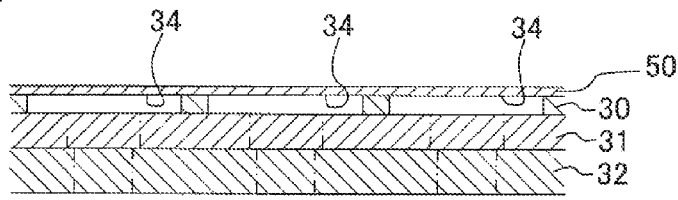
FIGS. 6A to 6E show steps of producing the ink-jet head according to the embodiment of the present invention.

At first, the holes, which constitute the ink flow passages including, for example, the pressure chambers 34 and the manifolds 37, are formed for the cavity plate 30, the base plate 31, and the manifold plate 32, which are included in the plates for constructing the flow passage unit 20. Each of the plates 30 to 32 is composed of the metal material. Therefore, the holes for constructing the ink flow passages can be easily formed by means of the etching. As shown in FIG. 6A, the four plates in total, which are provided by adding the sealing plate 50 made of metal to the three plates 30 to 32, are joined with an adhesive. Alternatively, the four plates made of metal may be joined by means of the metal diffusion bonding or metal diffusion joining.

Figure 6B:
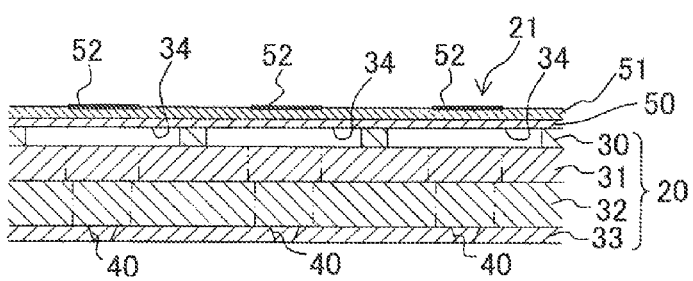

On the other hand, the plurality of individual electrodes 52 are formed on an unsintered green sheet by means of a known method such as the screen printing method, the vapor deposition method or the like. After that, the green sheet is calcined or sintered to thereby manufacture the piezoelectric layer 51 in a state in which the plurality of individual electrodes 52 are provided. As shown in FIG. 6B, the piezoelectric layer 51 is joined to the upper surface of the sealing plate 50 by means of an adhesive. Further, the plurality of nozzles 40 are formed through the nozzle plate 33 made of the synthetic resin by means of the laser processing or the like, and then the nozzle plate 33 is joined to the lower surface of the manifold plate 32 by using an adhesive.

In FIG. 6, the joining step of joining the piezoelectric actuator 21 to the flow passage unit 20 is divided into the two stages of the step of joining the sealing plate 50 to the cavity plate 30 (FIG. 6A) and the step of joining the piezoelectric layer 51 to the sealing plate 50 (FIG. 6B). However, the sealing plate 50 and the piezoelectric layer 51 may be integrated into one unit to provide the piezoelectric actuator 21 beforehand, and then the piezoelectric actuator 21 may be joined to the flow passage unit 20.

Figure 6C:
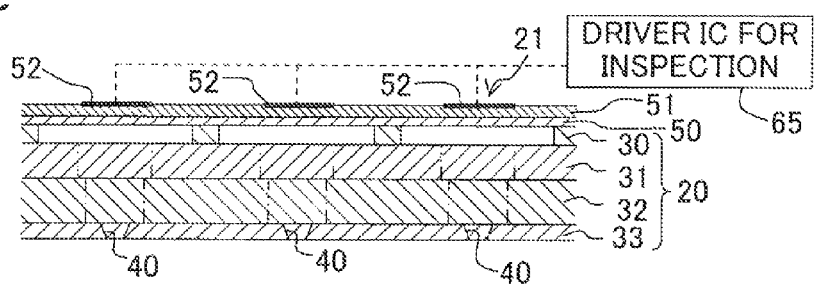

The stacked structure obtained in the step of FIG. 6B is provided with the necessary and minimum arrangement of the flow passage unit 20 and the piezoelectric actuator 21 for discharging the liquid droplets from the plurality of nozzles 40 respectively. Accordingly, the discharge characteristic is inspected for each of the plurality of nozzles 40 at this stage (inspecting step). However, in this state, FPC 60, on which the driver IC 61 (see FIG. 4) for supplying the driving pulse signal is mounted, is not connected to the plurality of individual electrodes 52. Therefore, as shown in FIG. 6C, a driver IC 65 for inspection is temporarily connected to the plurality of individual electrodes 52 to discharge the liquid droplets from the nozzles 40. As for the inspection of the discharge characteristic of the nozzle 40, the liquid droplet speed and the liquid droplet amount can be inspected for each of the nozzles 40, for example, such that the liquid droplets, which are discharged from the nozzles 40, are photographed by a high speed camera.

Figure 6D:
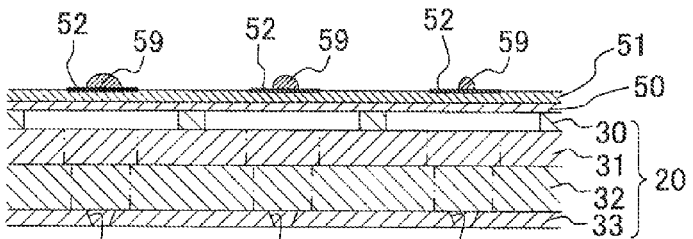

Subsequently, as shown in FIG. 6D, the plurality of bumps 59, which are provided to connect the plurality of individual electrodes 52 and FPC 60, are formed on the plurality of individual electrodes 52 (plurality of connecting terminals 55) respectively. The plurality of bumps 59 can be formed such that a curable material in liquid state (for example, a thermosetting resin) containing a conductive material is stuck to the surfaces of the plurality of connecting terminals 55 respectively, followed by being cured. Alternatively, the bumps 59 can be also formed such that the curable material in liquid state is discharged by a liquid droplet discharge apparatus having an appropriate structure, and liquid droplets of the curable material in liquid state are landed on predetermined positions of the plurality of connecting terminals 55 (so-called the ink-jet system). Further alternatively, the plurality of bumps 59 can be also formed by means of the screen printing method.

In this procedure, the sizes of the corresponding bumps 59 are determined depending on the discharge characteristics (liquid droplet speeds and liquid droplet amounts) of the plurality of nozzles 40 obtained in the inspecting step as described above. That is, the size of the corresponding bump 59 is increased to intensely suppress the deformation of the piezoelectric element 56 (deformation adjusting step) in relation to the nozzle 40 having the high discharge characteristic as compared with the nozzle 40 having the low discharge characteristic. When the bump 59 is formed by using the curable material in liquid state, the bump 59 having a desired size can be easily formed at a desired position. In particular, when the plurality of bumps 59 are formed in accordance with the ink-jet system as described above, the bumps 59 having desired sizes can be accurately formed at desired positions of the individual electrodes 52 (connecting terminals 55).

In this way, the discharge inspection is performed for the nozzles 40 in the state in which the liquid droplets can be discharged from the nozzles 40 after the piezoelectric actuator 21 is joined to the flow passage unit 20, and the sizes of the plurality of bumps 59 are determined depending on the result of the discharge inspection. Therefore, the discharge characteristics can be finally adjusted. In particular, even when the single units of the flow passage unit 20 and the piezoelectric actuator 21 do not have any inconvenience or malfunction to cause the dispersion of the discharge characteristic among the plurality of nozzles 40 respectively, then the characteristics of the plurality of piezoelectric elements 56 are different from each other in some cases depending on the joined state, for example, if the thickness of the adhesive layer is not uniform and/or the residual stress of the piezoelectric layer 51 is not uniform, when the piezoelectric actuator 21 is joined to the flow passage unit 20. However, the inspecting step is performed after joining the piezoelectric actuator 21 to the flow passage unit 20, and then the bumps 59, which have the sizes corresponding to the discharge characteristics of the nozzles 40, are formed. Thus, it is possible to perform the adjustment so that the difference in the deformation amount of the piezoelectric element 56 is decreased in accordance with the difference in the size of the bump 59. Accordingly, the dispersion of the discharge characteristic among the plurality of nozzles 40, which would be otherwise caused by the joining step, can be suppressed. Further, the deformation amount of the piezoelectric element 56 can be regulated by increasing/decreasing the size of the bump 59 which is provided as the member distinct from the actuator 21. Therefore, the deformation amount can be regulated with ease.

Figure 6E:
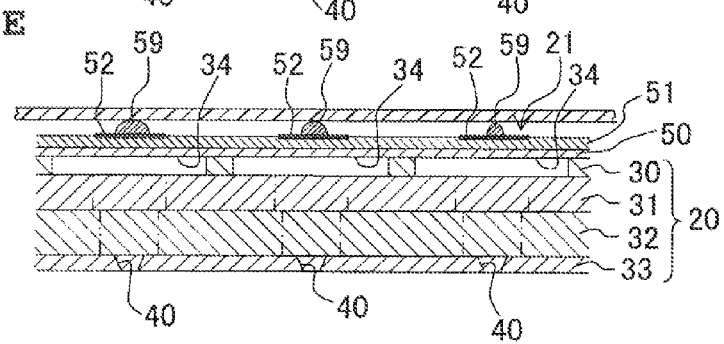

The plurality of bumps 59 are formed on the plurality of individual electrodes 52 respectively as described above, and then the plurality of bumps 59 are joined to the terminals of FPC 60 as shown in FIG. 6E. Thus, the driver IC 61 (see FIG. 4), which is mounted on FPC 60, is electrically connected to the plurality of individual electrodes 52.

Next, an explanation will be made about modified embodiments to which various modifications are applied to the embodiment described above. However, those constructed in the same manner as those of the embodiment described above are designated by the same reference numerals, any explanation of which will be appropriately omitted.

The deformation adjusting member for adjusting the deformation of the sealing plate 50 for defining the pressure chambers 34 is not limited to the deformation adjusting member constructed in the embodiment described above, which can be appropriately changed as exemplified as follows by way of example.

Figure 7:
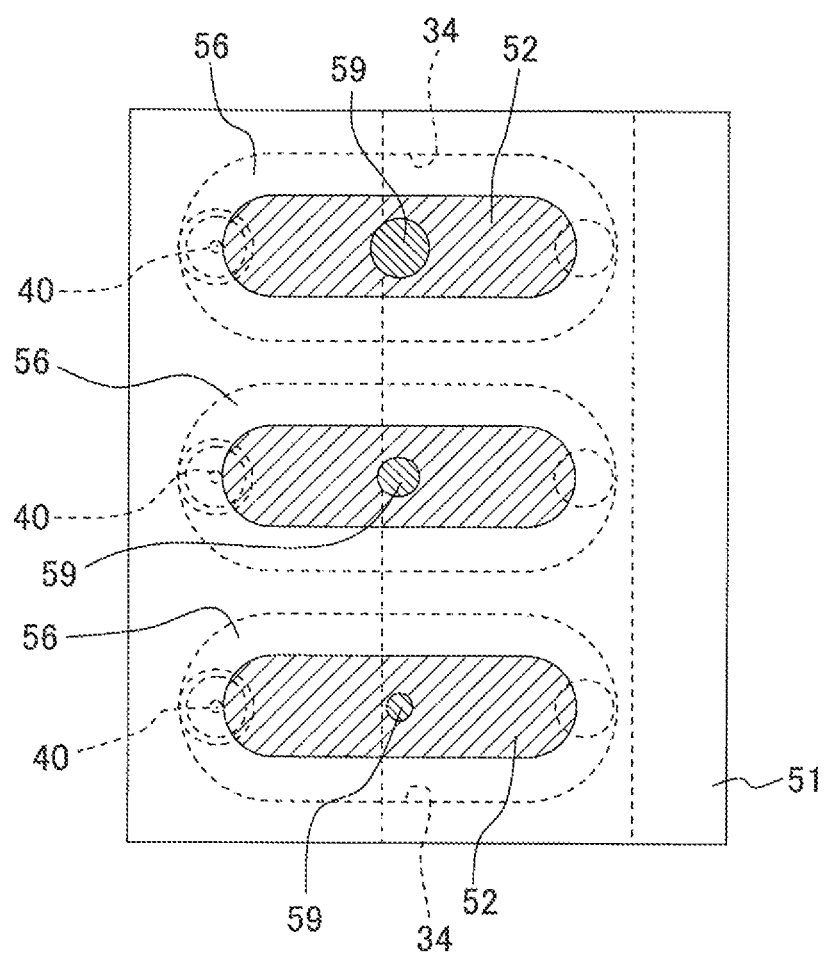
FIG. 7 shows a partial enlarged plan view illustrating an ink-jet head according to a first modified embodiment.

In the embodiment described above, the bump 59, which serves as the deformation adjusting member, is provided on the connecting terminal 55 led out to the outside of the pressure chamber 34 from the individual electrode 52. However, as shown in FIG. 7, the bump 59 may be provided on the surface of the individual electrode 52 opposed to the pressure chamber 34 (first modified embodiment). In this way, when the bump 59 is provided in the central area of the pressure chamber 34 having the large deformation amount of the piezoelectric element 56, the deformation of the sealing plate 50 can be effectively adjusted.

Figure 8:
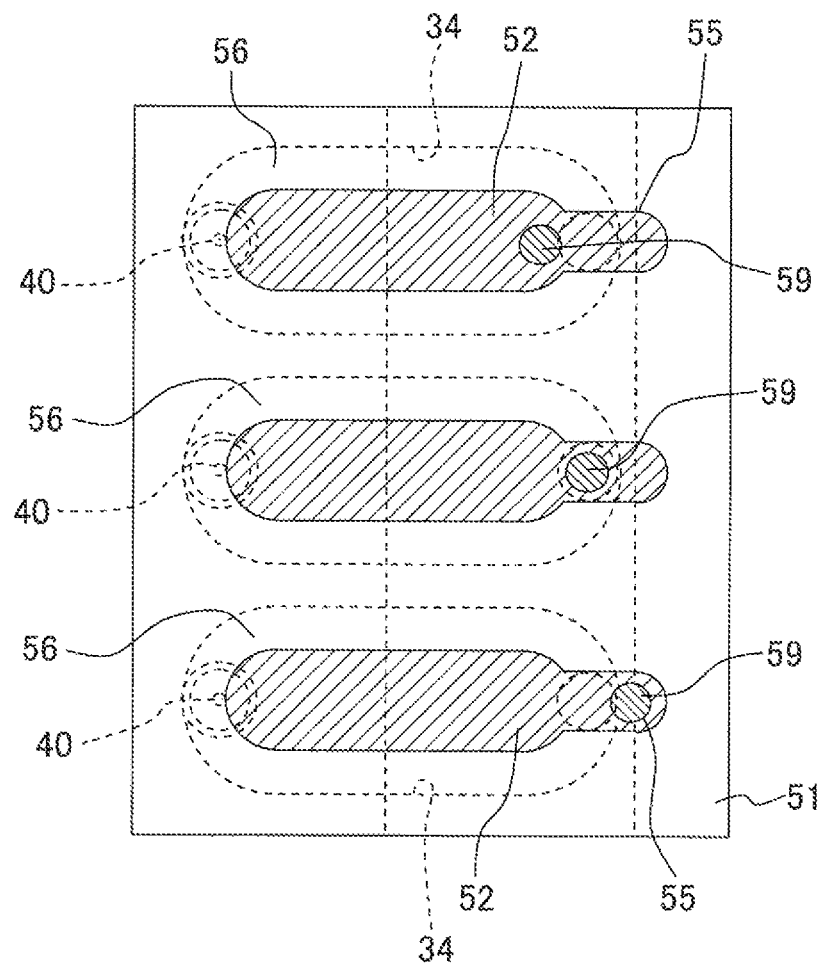
FIG. 8 shows a partial enlarged plan view illustrating an ink-jet head according to a second modified embodiment.

As shown in FIG. 8, the positions (sticking positions) of the plurality of bumps 59, which are provided on the surfaces of the piezoelectric elements 56 (individual electrodes 52 and connecting terminals 55), are allowed to differ. Accordingly, it is possible to change the deformation adjustment amount of the sealing plate 50 among the plurality of pressure chambers 34 (second modified embodiments). That is, the bump 59, which corresponds to the upper pressure chamber 34 included in the three pressure chambers 34 shown in FIG. 8, is disposed at the innermost position (deviated toward the center) of the pressure chamber 34, for which the deformation of the sealing plate 50 is strongly suppressed. In this arrangement, it is also allowable that the sizes of all of the plurality of bumps 59 are identical with each other.

Although not shown, the deformation adjustment amount of the sealing plate 50 can be also allowed to differ among the plurality of pressure chambers 34 by using different materials for the bumps 59 (third modified embodiment). That is, when a certain bump 59 is formed of a material having a hardness or an elastic modulus higher than those of other bumps 59, the deformation of the sealing plate 50 (piezoelectric element 56) is strongly suppressed in relation to the pressure chamber 34 corresponding to the concerning bump 59. The property of the material (for example, the hardness) of the bump 59 can be also changed by means of any aftertreatment after forming the bumps 59 with an identical material. For example, the hardnesses of the plurality of bumps 59 can be allowed to differ such that an ultraviolet-curable ink is stuck to the plurality of individual electrodes 52 to form the plurality of bumps 59 respectively, and then the intensity and/or the radiation time of the ultraviolet light radiated for the curing is/are allowed to differ.

Figure 9:
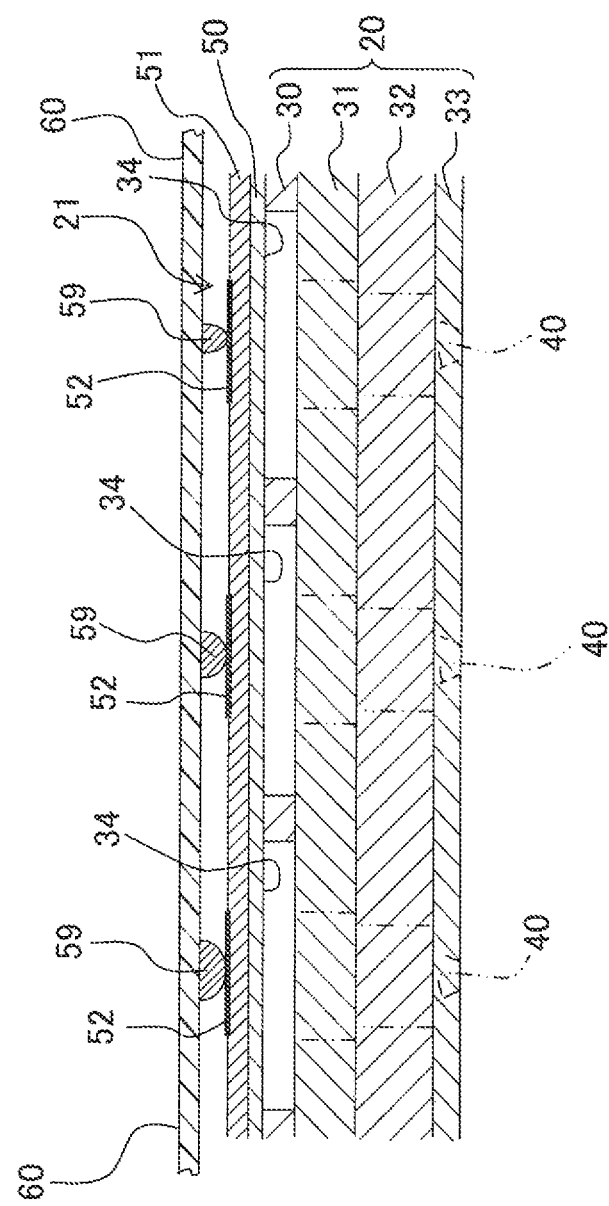
FIG. 9 shows a sectional view illustrating an ink-jet head according to a fourth modified embodiment.

As shown in FIG. 9, a plurality of bumps 59, which connect the plurality of individual electrodes 52 and FPC 60, may be provided on the side of FPC 60 (fourth modified embodiment). In this case, when the plurality of bumps 59 are formed in the step of producing FPC 60, it is appropriate to change, for example, the sizes, the positions (positions to make contact with the piezoelectric elements 56), and/or the materials of the plurality of bumps 59.

Figure 10:
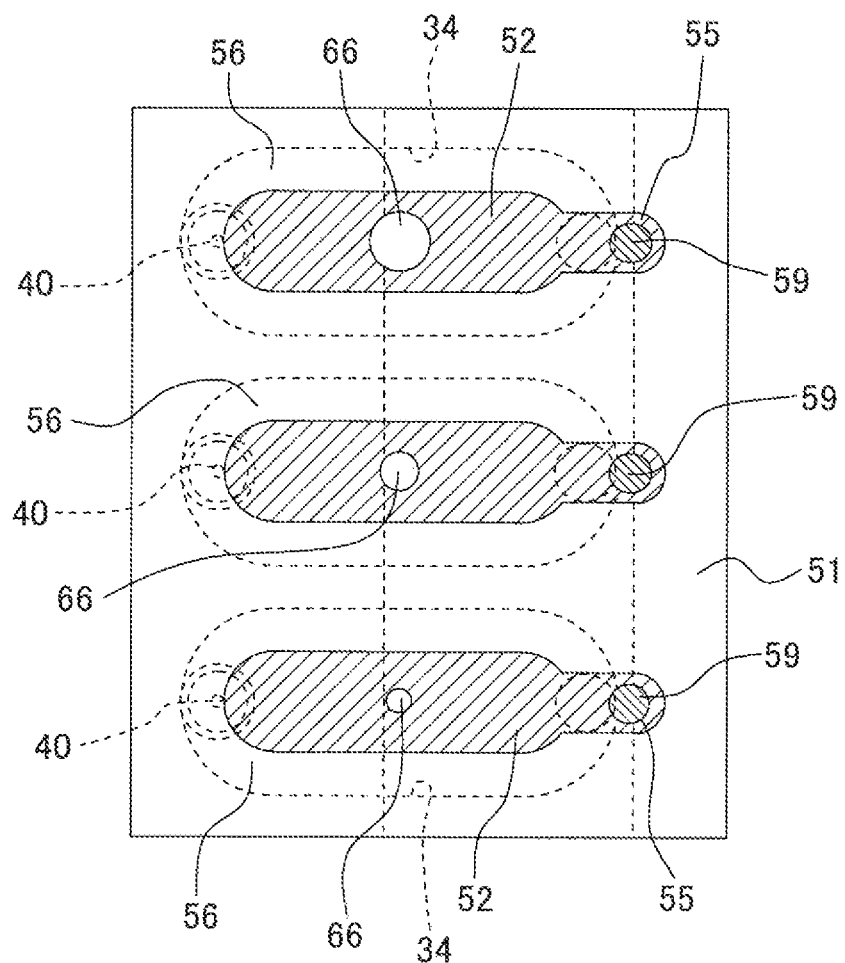
FIG. 10 shows a partial enlarged plan view illustrating an ink jet head according to a fifth modified embodiment.

It is not necessarily indispensable that the deformation adjusting member, which adjusts the deformation of the piezoelectric element 56, should be the bump 59 for connecting the individual electrode 52 and FPC 60. As shown in FIG. 10, it is also allowable to adopt such an arrangement that deformation adjusting members 66, which are distinct from the bumps 59, are stuck to the surfaces of the piezoelectric elements 56 (fifth modified embodiment). In this case, it is unnecessary that the deformation adjusting member 66 is formed of the conductive material. The deformation adjusting member 66 may be formed of an insulative material such as a resin or the like. It is also unnecessary that the deformation adjusting member 66 is stuck to the surface of the individual electrode 52. The deformation adjusting member 66 may be directly stuck to an area of the piezoelectric layer 51 (piezoelectric element 56) in which the individual electrode 52 is not provided.

Further, the deformation adjusting member 66 of the fifth modified embodiment may be formed on only the piezoelectric element 56 for which the adjustment of the deformation amount is required, unlike the bumps 59 which are provided for all of the piezoelectric elements 56 in order to effect the connection with respect to FPC 60. That is, it is also allowable to adopt such an arrangement that the deformation adjusting member 66 is provided for only the piezoelectric layer 56 in which the discharge characteristic of the nozzle 40 is higher than those of the other in order to suppress the deformation thereof, and the deformation is not adjusted for the other piezoelectric elements 56. For example, the deformation adjusting member 66 is not arranged for the piezoelectric element 56 corresponding to the nozzle 40 provided with the discharge characteristic which is used as the reference, and the deformation adjusting members 66 are arranged for some of the piezoelectric elements 56 in conformity with the discharge characteristic of the reference nozzle. In this way, it is easy to adjust the deformation amount of the piezoelectric element 56 in conformity with the discharge characteristic which is used as the reference. The discharge characteristic, which is used as the reference, can be appropriately determined.

Figure 11:
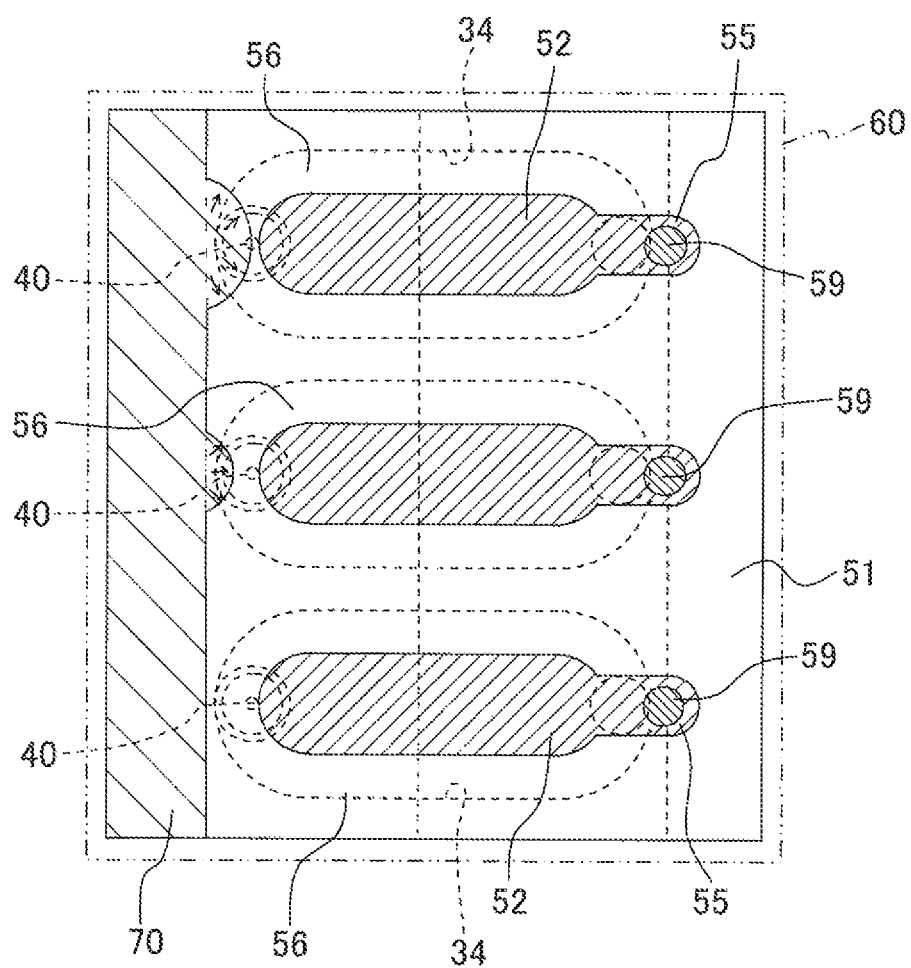
FIG. 11 shows a partial enlarged plan view illustrating an ink-jet head according to a sixth modified embodiment.

It is also allowable that the piezoelectric actuator 21 and FPC 60 arranged to cover the piezoelectric layer 51 (plurality of piezoelectric elements 56) are not only electrically connected by means of the plurality of bumps 59 but they are also physically joined by means of an adhesive in view of, for example, the prevention of exfoliation of FPC 60 (sixth modified embodiment). In this case, as shown in FIG. 11, the adhesive 70, which joins the piezoelectric actuator 21 and FPC 60, is also stuck to the surfaces of the piezoelectric elements 56 so that the adhesive 70 functions as the deformation adjusting member. Further, the sticking amounts and/or sticking positions of the adhesive 70 may be allowed to differ among the plurality of piezoelectric elements 56, and thus the deformation adjustment amounts may be allowed to differ.

When the step of adjusting the deformation amount by means of the adhesive 70 is performed before the joining of FPC 60 as described above, the adhesive 70 may be subjected to the patterning so that the adhesive 70 is stuck to arrive at the areas opposed to some of the pressure chambers 34 as shown in FIG. 11 on the surface of the piezoelectric actuator 21.

The sticking areal size and/or the sticking position of the adhesive 70 can be changed even after the step of joining FPC 60 to the piezoelectric actuator 21 (step of joining the wiring member). For example, when a board, which is formed of a resin material capable of transmitting the laser beam therethrough, is used as FPC 60, then the laser beam can be radiated from the surface of FPC 60 (surface on the front side of the paper surface of FIG. 11) disposed on the side opposite to the piezoelectric actuator 21, the adhesive 70, which is disposed between the piezoelectric layer 51 and FPC 60, can be thereby melted by means of the laser beam transmitted through FPC 60, and thus the adhesive 70 can be stuck while being spread to the surfaces of some of the piezoelectric elements 56 as shown by the arrows in the drawing. Therefore, for example, when the radiation position, the radiation time, and/or the radiation intensity of the laser beam is/are allowed to differ for the plurality of piezoelectric elements 56, then the sticking areal size and/or the sticking position of the adhesive 70 can be allowed to differ among the plurality of piezoelectric elements 56 even after the joining step, and thus the deformation adjustment amount can be allowed to differ.

When the deformation amount is adjusted by allowing the sticking areal size and/or the sticking position of the adhesive 70 to differ after the joining of FPC 60 as described above, then FPC 60 is formerly joined to the piezoelectric actuator 21, and the piezoelectric actuator 21 is driven by the driver IC 61 of FPC 60 in this state. Accordingly, it is possible to perform the inspection of the discharge characteristics of the nozzles 40. Therefore, unlike the embodiment described above, it is possible to omit the time and labor of the connection of the driver IC 65 for inspection (see FIG. 6C) to the piezoelectric actuator 21 only for the purpose of the inspection of the discharge characteristics.

Figure 12:
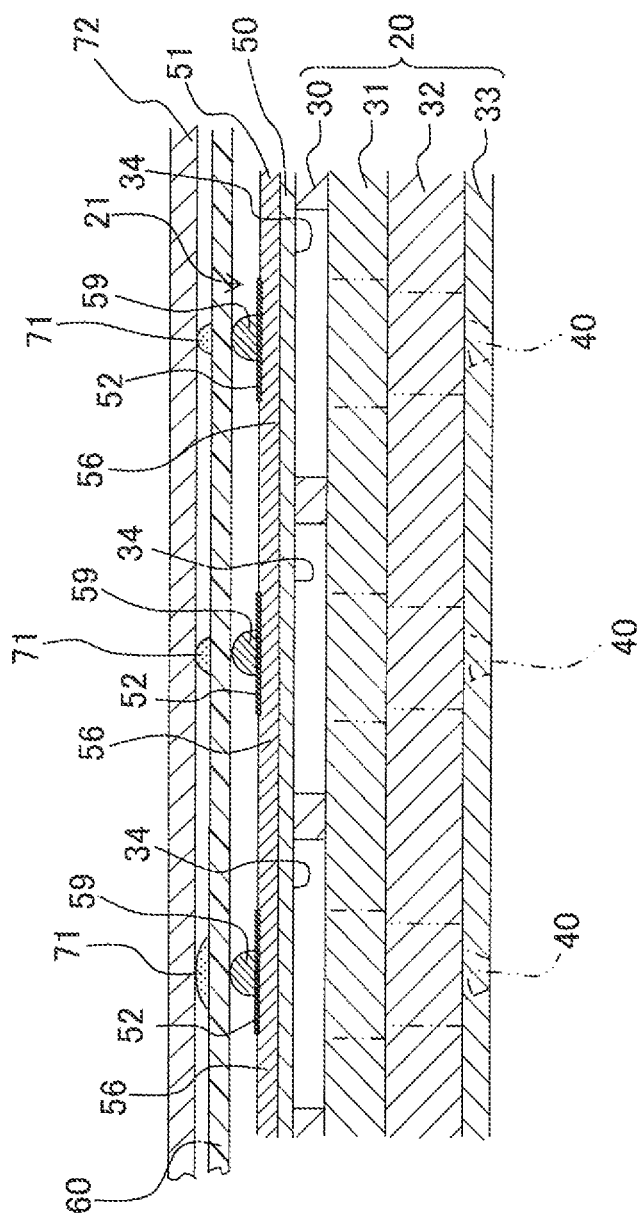
FIG. 12 shows a sectional view illustrating an ink-jet head according to a seventh modified embodiment.

The deformation adjusting member is not limited to the deformation adjusting member which is stuck to the surface of the piezoelectric element 56 to adjust the deformation amount. It is also appropriate to adjust the deformation amount by allowing the external force to act on the piezoelectric element 56 (seventh modified embodiment). For example, with reference to FIG. 12, a flat plate-shaped pressing member 72 abuts against the surface of FPC 60 disposed on the side opposite to the joining surface with respect to the piezoelectric actuator 21, and FPC 60 is joined while being pressed against the piezoelectric actuator 21 by the pressing member 72. In this arrangement, when a plurality of projections 71 are provided at positions opposed to the plurality of pressure chambers 34 respectively on the surface of FPC 60 allowed to abut against the pressing member 72, the external force is allowed to locally act on the plurality of piezoelectric elements 56 by means of the plurality of projections 71 when FPC 60 is pressed against the piezoelectric actuator 21 by the pressing member 72. Therefore, the deformation is suppressed for the piezoelectric elements 56. The magnitude of the external force and/or the position for allowing the external force to act can be allowed to differ depending on, for example, the size, the position, and the material of the projection 71. It is possible to allow the deformation adjustment amounts of the plurality of piezoelectric elements 56 to differ. That is, the plurality of projections 71 correspond to the deformation adjusting member according to the present invention.

In the embodiment described above, the deformation adjusting member (for example, the bump 59) suppresses the deformation of the piezoelectric element 56 and the sealing plate 50 corresponding to a certain pressure chamber 34, and thus the adjustment is performed in the direction in which the deformation amount is decreased. However, it is also allowable that the deformation is facilitated for the sealing plate 50 and the piezoelectric element 56, and the adjustment is performed in the direction in which the deformation amount is increased (eighth modified embodiment). In other words, it is also allowable that the discharge characteristic of the nozzle having the highest discharge characteristic is used as the reference.

Figure 13:
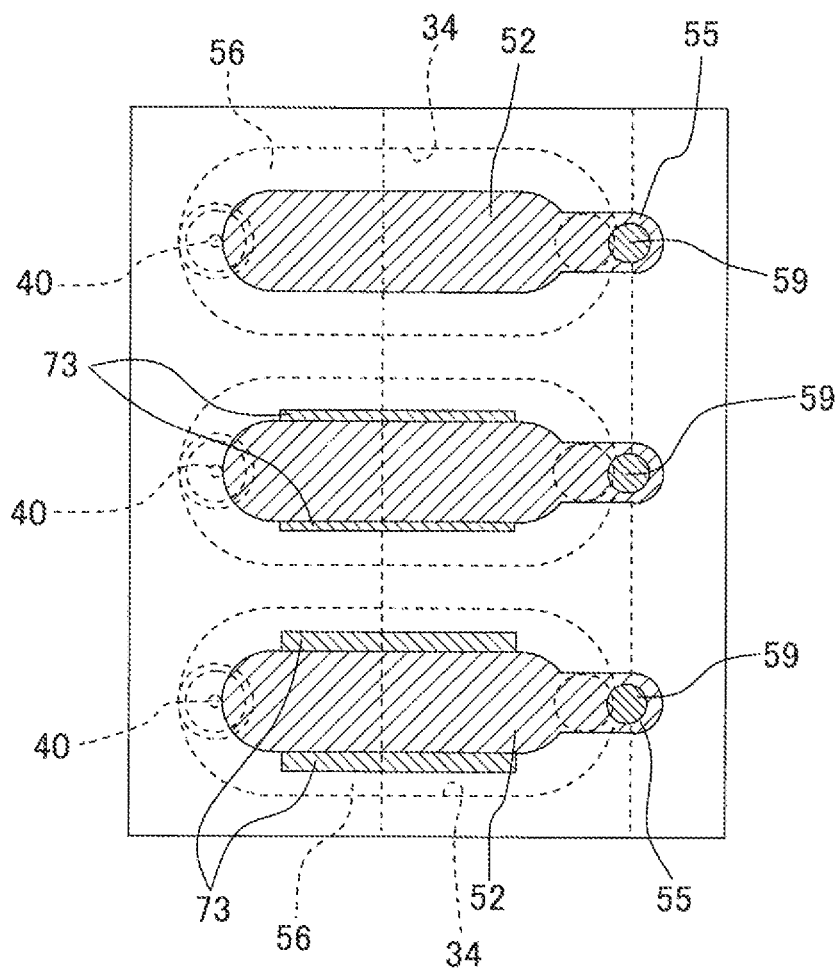
FIG. 13 shows a partial enlarged plan view illustrating an ink-jet head according to an eighth modified embodiment.

For example, as shown in FIG. 13, a conductive resin 73 is applied to the positions disposed on the both sides in the widthwise direction of the individual electrode 52, of the piezoelectric element 56 opposed to the pressure chamber 34 so that the conductive resin 73 is in conduction with the individual electrode 56, and thus the areal size of the individual electrode 52 is substantially increased. Accordingly, the active portion of the piezoelectric element 56, to which the voltage is applied, is increased. Therefore, it is possible to increase the deformation amount of the piezoelectric element 56. That is, the conductive resin 73 corresponds to the deformation adjusting member. When the areal size of the individual electrode 52 is substantially increased, the rigidity of the piezoelectric element 56 is slightly raised. The deformation of the piezoelectric element 56 is somewhat suppressed by the increase in the rigidity. However, when the conductive resin is applied and spread to be thin so that the increase in the rigidity is suppressed to be small, then the areal size of the active portion is increased, and thus it is possible to realize the improvement in the deformation amount which exceeds the decrease in the deformation amount caused by the increase in the rigidity.

If the area of application of the conductive resin 73 is increased to be not less than a certain size, and the areal size of the active portion is widened, then the area which ranges from the active portion of the piezoelectric element 56 to the edge of the pressure chamber 34, i.e., the area which is deformed passively in accordance with the deformation (spontaneous deformation) of the active portion is decreased, the deformation constraint force, which is received by the active portion from the edge of the pressure chamber 34, is consequently strengthened, and the deformation amount of the piezoelectric element 56 is decreased (for example, if the individual electrode 52 is formed over the entire width of the pressure chamber 34, then the active portion cannot be shrunk in the in-plane direction on account of the large constraint force in the in-plane direction received by the active portion from the edge of the pressure chamber 34, and the sealing plate 50 is hardly deformed). Further, the areal size of the individual electrode 52 becomes fairly large. Therefore, the suppression of deformation, which is caused by the increase in the rigidity, is strengthened as well. In other words, the deformation amount of the sealing plate 50 can be also decreased by increasing the area of application of the conductive resin 73 to be not less than a certain size.

The structure or arrangement of the actuator for applying the pressure to the ink contained in the plurality of pressure chambers 34 is not limited to the structure or arrangement of the embodiment described above, which can be appropriately changed.

Figure 14:
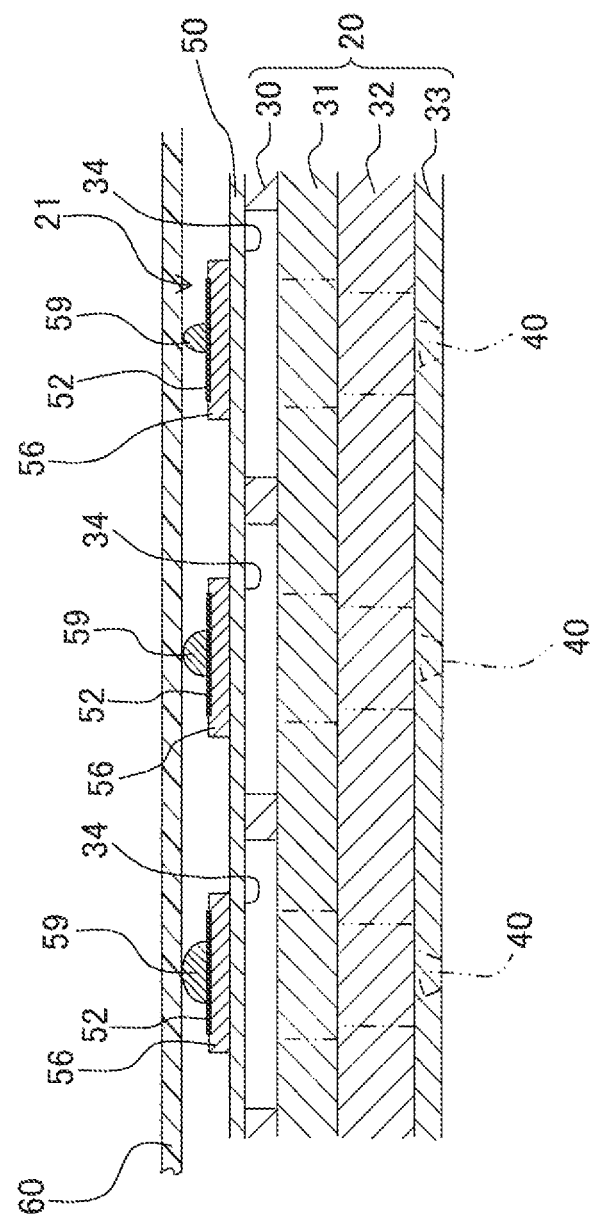
FIG. 14 shows a sectional view illustrating an ink-jet head according to a ninth modified embodiment.

The plurality of piezoelectric elements 56, which correspond to the plurality of pressure chambers 34 respectively, may be provided while being separated from each other on the surface of the sealing plate 50 disposed on the side opposite to the pressure chamber 34 as shown in FIG. 14 (ninth modified embodiment), unlike the embodiment described above shown in FIG. 4 in which the piezoelectric layer 51 is formed continuously in the planar form. FIG. 14 is illustrative of such an exemplary case that bumps 59, which are provided on the individual electrodes 52 disposed on the surfaces of the isolated individual piezoelectric elements 56, function as the deformation adjusting members. When the plurality of piezoelectric elements 56 are separated from each other, parts of the sealing plate 50 are exposed as shown in FIG. 14. Therefore, the deformation adjusting members may be constructed such that they are provided directly on the exposed portions of the sealing plate 50 (portions provided with no piezoelectric element 56) and the deformation of the sealing plate 50 itself is suppressed.

Figure 15:
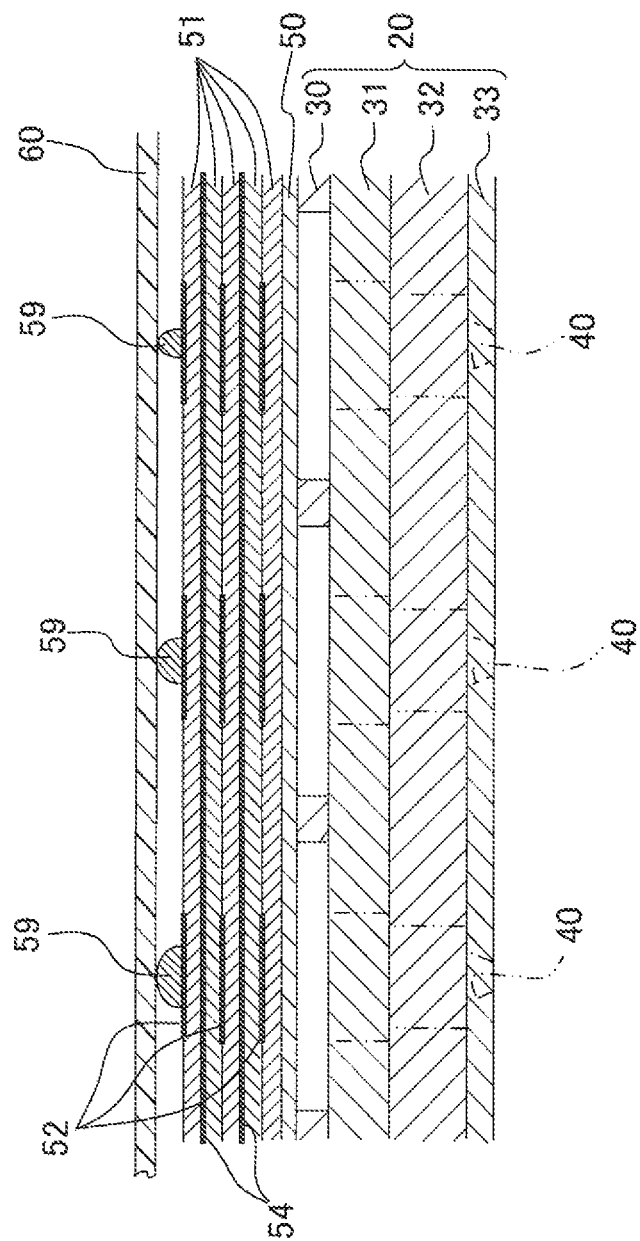
FIG. 15 shows a sectional view illustrating an ink-jet head according to a tenth modified embodiment.

As shown in FIG. 15, it is also allowable to provide a so-called stacked type piezoelectric actuator in which a plurality of sheets of piezoelectric layers 51 are stacked on the sealing plate 50, and individual electrodes 52 and common electrodes 54 are alternately arranged between the plurality of sheets of piezoelectric layers 51 (tenth modified embodiment). Also in this case, it is possible to provide different deformation adjustment amounts in relation to the piezoelectric elements 56 composed of the plurality of sheets of piezoelectric layers 51 and the sealing plate 50 by providing, for example, different sizes of the bumps 59 provided on the individual electrodes 52 on the surface of the piezoelectric layer 51.

In the piezoelectric actuators of the embodiment described above and the eighth and ninth modified embodiments, it is not, especially indispensable that the sealing plate 50 is formed of the metal material. The sealing plate 50 may be a plate formed of a piezoelectric material in the same manner as the piezoelectric element 56.

The actuator, which applies the pressure to the ink contained in the pressure chambers 34, is not limited to the piezoelectric actuator 21 for deforming the sealing plate 50 as in the embodiment described above. For example, the sealing plate 50 may be deformed by means of any driving element other than the piezoelectric element 56 (eleventh modified embodiment). Alternatively, a side wall portion may be deformed without deforming the upper wall portion of the pressure chamber 34 (sealing plate 50).

The embodiment described above is constructed such that the deformation adjustment amounts of the sealing plate 50, which are provided for some of the pressure chambers 34, are different from the deformation adjustment amounts of the sealing plate 50 which are provided for the other pressure chambers 34 so that the dispersion of the discharge characteristic is decreased for the plurality of nozzles 40 in one ink-jet head 4.

On the other hand, the present invention is also applicable to eliminate the dispersion of the discharge characteristic for the nozzles 40 between two or more, i.e., a plurality of ink-jet heads 4 (twelfth modified embodiment). For example, the piezoelectric characteristic slightly differs between the piezoelectric layers 51 sintered as distinct lots in many cases. In this way, even when the dispersion of the discharge characteristic is not large so much among the plurality of nozzles 40 included in one ink-jet head 4, the discharge characteristic differs in some cases between the ink-jet heads 4 produced as distinct lots. In such a situation, the following procedure is also appropriate. That is, the discharge characteristic is inspected for the respective ink-jet heads 4. After that, the deformation adjusting members for suppressing the deformation of the sealing plate 50 are provided for all of the nozzles 40 in relation to the ink-jet head 4 having the higher discharge characteristic, and the discharge characteristics of all of the nozzles 40 are lowered substantially uniformly. Accordingly, the difference in the discharge characteristic is decreased with respect to the distinct ink-jet head 4.

In the embodiment described above, the discharge characteristics of the plurality of nozzles 40 are inspected, and the deformation amounts of the sealing plate 50 and the piezoelectric elements 56 are adjusted in accordance with the obtained discharge characteristics. However, if it can be predicted that the discharge characteristics of some of the nozzles 40 may be different from those of the other nozzles 40 in view of, for example, the structure, it is not necessarily indispensable that the discharge characteristics of the plurality of nozzles 40 should be inspected.

For example, as shown in FIG. 16, when the piezoelectric layer 51 is formed to spread in a planar form while ranging over the plurality of pressure chambers 34 on the upper surface of the sealing plate 50 in the same manner as in the arrangement of the embodiment described above, then the constraint condition of the piezoelectric layer 51 differs in the pressure chamber 34a which is disposed at the end position near to the edge 51a of the piezoelectric layer 51 (pressure chamber 34a for which any other pressure chamber 34 is absent between itself and the edge 51a of the piezoelectric layer 51) of the plurality of pressure chambers 34, on account of the small number of adjoining pressure chambers 34 as compared with the other pressure chambers 34b, 34c, and the difference tends to appear in the deformation amount of the piezoelectric layer 51 (sealing plate 50) between the both. A more specified example will be described as follows. That is, there is such a tendency that the deformation amount of the piezoelectric layer 51 differs between the pressure chamber 34 which is positioned at the end of the pressure chamber array near to the edge of the piezoelectric layer 31 and the pressure chamber 34 which is positioned at the central portion of the pressure chamber array far from the edge of the piezoelectric layer 31 in relation to the pressure chamber arrays of the central two arrays shown in FIG. 2. Accordingly, the deformation adjustment amount of the piezoelectric layer 51 (piezoelectric element 56), which is brought about by the deformation adjusting member (bump 59 shown in FIG. 16), is allowed to differ between the pressure chamber 34a disposed at the end position and the pressure chambers 34b, 34c other than the above (thirteenth modified embodiment).

It cannot be unconditionally asserted which one of the pressure chamber 34a disposed at the end position and the pressure chambers 34b, 34b other than the above has the higher discharge characteristic. The pressure chamber 34a, 34b, 34c having the higher discharge characteristic is determined depending on the actual structure. For example, when the distance (i.e., the adhesion area) between the pressure chamber 34a disposed at the end position and the edge 51a of the piezoelectric layer 51 is large, then the constraint is intense with respect to the piezoelectric element 56 opposed to the pressure chamber 34a disposed at the end position, and the sealing plate 50 is hardly deformed. Accordingly, in such a situation, for example, the corresponding bump 59 is increased with respect to the other pressure chambers 34b, 34c, and the suppression of deformation of the sealing plate 50 is strengthened as compared with the pressure chamber 34a disposed at the end position.

On the other hand, a large tensile residual stress sometimes arises in the piezoelectric element 56 in relation to the pressure chamber 34a disposed at the end position on account of the warpage of the piezoelectric layer 51 brought about when the green sheet is sintered, as compared with the other pressure chambers 34b, 34c. The tensile residual stress acts in the direction to improve the piezoelectric characteristic of the piezoelectric element 56, and the deformation amount of the piezoelectric element 56 is increased. Therefore, the discharge characteristic is raised for the nozzle 40 communicated with the pressure chamber 34a disposed at the end position. In the case of such a situation, the suppression of deformation of the sealing plate 50 is strengthened, for example, by increasing the bump 59 corresponding to the pressure chamber 34 disposed, at the end position as shown in FIG. 15.

The embodiment described above is the exemplary case in which the present invention is applied to the ink-jet head for recording an image by discharging the liquid droplets of the ink onto the recording paper. However, the deviation of the landing position and the difference in the liquid droplet amount, which are caused by the dispersion of the discharge characteristics of the plurality of nozzles, may also cause a serious problem in any liquid droplet discharge apparatus used for the way of use other than the image recording. Therefore, in the case of any liquid droplet discharge apparatus other than the ink-jet head, it is also effective to suppress the dispersion of the discharge characteristic by applying the present invention.

The application of the present invention is not limited to the actuator of the liquid droplet discharge apparatus as well. The present invention is also applicable, for example, to piezoelectric actuators to be used in a variety of field including, for example, a light-reflecting element in which the optical path is changed by changing a reflecting surface in accordance with the deformation of a piezoelectric element.

What is claimed is:

1. A liquid droplet discharge apparatus which discharges liquid droplets of a liquid, the apparatus comprising:
   a flow passage unit which is formed with a plurality of nozzles for discharging the liquid droplets of the liquid and a plurality of liquid flow passages including a plurality of pressure chambers communicated with the plurality of nozzles respectively;
   an actuator which has a sealing plate joined to the flow passage unit for defining the plurality of pressure chambers and which applies a pressure to the liquid contained in each of the plurality of pressure chambers by changing a volume of each of the plurality of pressure chambers by deforming the sealing plate; and a deformation adjusting member which adjusts a deformation amount of the sealing plate;

wherein the deformation adjusting member is constructed so that a portion of the sealing plate, which corresponds to one of the pressure chambers, has a deformation adjustment amount that is different from deformation adjustment amounts of portions of the sealing plate, which correspond to the other pressure chambers; and wherein the deformation adjusting member is constructed so that the deformation amounts of portions of the sealing plate corresponding to the pressure chambers communicated with the plurality of nozzles respectively are adjusted depending on discharge characteristics of the plurality of nozzles.

2. The liquid droplet discharge apparatus according to claim 1;

wherein the plurality of pressure chambers are formed to have recessed shapes having openings respectively, the plurality of pressure chambers being arranged in a planar form along one surface of the flow passage unit;

wherein the sealing plate is joined to the one surface of the flow passage unit to cover the openings of the plurality of pressure chambers therewith;

wherein the actuator has a plurality of driving elements which are provided on the sealing plate and which deform portions of the sealing plate facing the plurality of pressure chambers respectively; and wherein the deformation adjusting member is constructed so that portions of the sealing plate, which are facing some of the pressure chambers, have deformation adjustment amounts that are different from deformation adjustment amounts of portions which are facing the other pressure chambers.

3. The liquid droplet discharge apparatus according to claim 2;

wherein the actuator has a plurality of piezoelectric elements which are provided as the plurality of driving elements and which are provided on portions of the sealing plate facing the plurality of pressure chambers respectively;

wherein the deformation adjusting member includes a plurality of deformation adjusting members;

wherein the deformation adjusting members adjust deformation amounts of the sealing plate by adjusting deformation amounts of the piezoelectric elements, respectively; and wherein the deformation adjusting members are constructed so that the piezoelectric elements, which correspond to some of the pressure chambers, have deformation adjustment amounts that are different from deformation adjustment amounts of the piezoelectric elements which correspond to the other pressure chambers.

4. The liquid droplet discharge apparatus according to claim 3;

wherein the deformation adjusting members are adhered to the piezoelectric elements, respectively.

5. The liquid droplet discharge apparatus according to claim 4;

wherein adhering areal sizes of the deformation adjusting members adhered to the piezoelectric elements corresponding to some of the pressure chambers are different from adhering areal sizes of the deformation adjusting members adhered to the piezoelectric elements corresponding to the other pressure chambers.

6. The liquid droplet discharge apparatus according to claim 4;

wherein adhering positions of the deformation adjusting members adhered to the piezoelectric elements corresponding to some of the pressure chambers are different from adhering positions of the deformation adjusting members adhered to the piezoelectric elements corresponding to the other pressure chambers.

7. The liquid droplet discharge apparatus according to claim 4;

wherein a material of the deformation adjusting members adhered to the piezoelectric elements corresponding to some of the pressure chambers is different from a material of the deformation adjusting members adhered to the piezoelectric elements corresponding to the other pressure chambers.

8. The liquid droplet discharge apparatus according to claim 3;

wherein the plurality of piezoelectric elements are provided on a surface of the sealing plate disposed on a side opposite to the pressure chambers;

wherein a plurality of surface electrodes are provided on surfaces of the plurality of piezoelectric elements disposed on a side opposite to the sealing plate respectively;

wherein a wiring member is connected to the plurality of surface electrodes; and wherein the deformation adjusting members are provided as a plurality of conductive bumps on each of the surface electrodes and each of the bumps electrically connects one of the surface electrodes and one of a plurality of wiring lines of the wiring member.

9. The liquid droplet discharge apparatus according to claim 3;

wherein the plurality of piezoelectric elements are provided on a surface of the sealing plate disposed on a side opposite to the pressure chambers;

wherein a plurality of surface electrodes are provided on surfaces of the plurality of piezoelectric elements disposed on a side opposite to the sealing plate respectively;

wherein a wiring member is joined to the actuator having the plurality of piezoelectric elements by an adhesive, the plurality of surface electrodes being electrically connected to a plurality of wiring lines of the wiring member respectively; and wherein the deformation adjusting members are the adhesive adhered to a surface of each of the piezoelectric elements disposed on a side opposite to the sealing plate.

10. The liquid droplet discharge apparatus according to claim 3;

wherein a piezoelectric layer, which is spread in a planar form while ranging over the plurality of pressure chambers, is joined to a surface of the sealing plate disposed on a side opposite to the pressure chambers, the plurality of piezoelectric elements being constructed by portions of the piezoelectric layer facing the plurality of pressure chambers respectively; and wherein the deformation adjusting members are constructed so that the piezoelectric element, which corresponds to such a pressure chamber that any other pressure chamber is absent between the concerning pressure chamber and an edge of the piezoelectric layer as viewed in a direction perpendicular to the piezoelectric layer, has the deformation adjustment amount that is different from the deformation adjustment amount of the piezoelectric element which corresponds to the other pressure chamber.

* * * * *